US011809727B1

(12) United States Patent
Tuzzolino et al.

(10) Patent No.: US 11,809,727 B1
(45) Date of Patent: Nov. 7, 2023

(54) PREDICTING FAILURES IN A STORAGE SYSTEM THAT INCLUDES A PLURALITY OF STORAGE DEVICES

(71) Applicant: Pure Storage, Inc., Mountain View, CA (US)

(72) Inventors: Frank Tuzzolino, San Jose, CA (US); John Colgrove, Los Altos, CA (US); Taher Vohra, Sunnyvale, CA (US); Andrew Kleinerman, Belmont, CA (US); Xiaohui Wang, San Jose, CA (US); Benjamin Scholbrock, Sunnyvale, CA (US)

(73) Assignee: PURE STORAGE, INC., Santa Clara, CA (US)

( * ) Notice: Subject to any disclaimer, the term of this patent is extended or adjusted under 35 U.S.C. 154(b) by 445 days.

(21) Appl. No.: 15/965,961

(22) Filed: Apr. 29, 2018

Related U.S. Application Data

(63) Continuation-in-part of application No. 15/786,187, filed on Oct. 17, 2017, now Pat. No. 10,564,884, (Continued)

(51) Int. Cl.
*G06F 3/06* (2006.01)
*G11C 11/4074* (2006.01)
*G11C 11/4096* (2006.01)

(52) U.S. Cl.
CPC ............ *G06F 3/0647* (2013.01); *G06F 3/067* (2013.01); *G06F 3/0607* (2013.01);
(Continued)

(58) Field of Classification Search
CPC ...... G06F 3/0647; G06F 3/0607; G06F 3/067; G06F 3/0683; G11C 11/4074; G11C 11/4096
See application file for complete search history.

(56) References Cited

U.S. PATENT DOCUMENTS 5,706,210 A 1/1998 Kumano et al.
5,799,200 A 8/1998 Brant et al.
(Continued)

FOREIGN PATENT DOCUMENTS

CN 108885538 A 11/2018
EP 0725324 A2 8/1996
(Continued)

OTHER PUBLICATIONS

Paul Sweere, *Creating Storage Class Persistent Memory with NVDIMM*, Published in Aug. 2013, Flash Memory Summit 2013, <http://ww.flashmemorysummit.com/English/Collaterals/Proceedings/2013/20130814_T2_Sweere.pdf>, 22 pages.
(Continued)

*Primary Examiner* — Prasith Thammavong

(57) ABSTRACT

Predicting failures in a storage system that includes a plurality of storage devices, including: gathering information describing a plurality of blocks within the storage devices; developing, using the information describing the plurality of blocks within the storage devices and information describing known dead block conditions, a block lifespan model; and determining, in dependence upon the information describing the plurality of blocks within the storage devices and the block lifespan model, a predicted lifespan for the plurality of blocks within the storage devices.

15 Claims, 19 Drawing Sheets

Related U.S. Application Data which is a continuation of application No. 15/140,445, filed on Apr. 27, 2016, now Pat. No. 9,841,921.

(52) U.S. Cl.
CPC ........ *G06F 3/0683* (2013.01); *G11C 11/4074* (2013.01); *G11C 11/4096* (2013.01)

(56) References Cited

U.S. PATENT DOCUMENTS

| | | | |
|---|---|---|---|
| 5,933,598 A | 8/1999 | Scales et al. | |
| 6,012,032 A | 1/2000 | Donovan et al. | |
| 6,085,333 A | 7/2000 | DeKoning et al. | |
| 6,643,641 B1 | 11/2003 | Snyder | |
| 6,647,514 B1 | 11/2003 | Umberger et al. | |
| 6,789,162 B1 | 9/2004 | Talagala et al. | |
| 6,978,259 B1 | 12/2005 | Anderson et al. | |
| 7,089,272 B1 | 8/2006 | Garthwaite et al. | |
| 7,103,732 B1* | 9/2006 | Chang ................ | G06F 12/0246 711/155 |
| 7,107,389 B2 | 9/2006 | Inagaki et al. | |
| 7,146,521 B1 | 12/2006 | Nguyen | |
| 7,334,124 B2 | 2/2008 | Pham et al. | |
| 7,437,530 B1 | 10/2008 | Rajan | |
| 7,493,424 B1 | 2/2009 | Bali et al. | |
| 7,669,029 B1 | 2/2010 | Mishra et al. | |
| 7,689,609 B2 | 3/2010 | Lango et al. | |
| 7,743,191 B1 | 6/2010 | Liao | |
| 7,783,787 B1 | 8/2010 | DeBergalis et al. | |
| 7,899,780 B1 | 3/2011 | Shmuylovich et al. | |
| 8,042,163 B1 | 10/2011 | Karr et al. | |
| 8,086,585 B1 | 12/2011 | Brashers et al. | |
| 8,200,887 B2 | 6/2012 | Bennett | |
| 8,271,700 B1 | 9/2012 | Annem et al. | |
| 8,387,136 B2 | 2/2013 | Lee et al. | |
| 8,437,189 B1 | 5/2013 | Montierth et al. | |
| 8,465,332 B2 | 6/2013 | Hogan et al. | |
| 8,527,544 B1 | 9/2013 | Colgrove et al. | |
| 8,566,534 B1 | 10/2013 | Pruthi et al. | |
| 8,566,546 B1 | 10/2013 | Marshak et al. | |
| 8,578,442 B1 | 11/2013 | Banerjee | |
| 8,613,066 B1 | 12/2013 | Brezinski et al. | |
| 8,620,970 B2 | 12/2013 | English et al. | |
| 8,751,463 B1 | 6/2014 | Chamness | |
| 8,762,642 B2 | 6/2014 | Bates et al. | |
| 8,769,622 B2 | 7/2014 | Chang et al. | |
| 8,800,009 B1 | 8/2014 | Beda, III et al. | |
| 8,812,860 B1 | 8/2014 | Bray | |
| 8,850,546 B1 | 9/2014 | Field et al. | |
| 8,898,346 B1 | 11/2014 | Simmons | |
| 8,909,854 B2 | 12/2014 | Yamagishi et al. | |
| 8,931,041 B1 | 1/2015 | Banerjee | |
| 8,949,863 B1 | 2/2015 | Coatney et al. | |
| 8,984,602 B1 | 3/2015 | Bailey et al. | |
| 8,990,905 B1 | 3/2015 | Bailey et al. | |
| 9,081,713 B1 | 7/2015 | Bennett | |
| 9,124,569 B2 | 9/2015 | Hussain et al. | |
| 9,134,922 B2 | 9/2015 | Rajagopal et al. | |
| 9,189,334 B2 | 11/2015 | Bennett | |
| 9,209,973 B2 | 12/2015 | Aikas et al. | |
| 9,250,823 B1 | 2/2016 | Kamat et al. | |
| 9,300,660 B1 | 3/2016 | Borowiec et al. | |
| 9,311,182 B2 | 4/2016 | Bennett | |
| 9,444,822 B1 | 9/2016 | Borowiec et al. | |
| 9,448,919 B1 | 9/2016 | Boyle | |
| 9,507,532 B1 | 11/2016 | Colgrove et al. | |
| 9,632,870 B2 | 4/2017 | Bennett | |
| 9,841,921 B2 | 12/2017 | Colgrove et al. | |
| 10,564,884 B1 | 2/2020 | Colgrove et al. | |
| 2002/0013802 A1 | 1/2002 | Mori et al. | |
| 2003/0145172 A1 | 7/2003 | Galbraith et al. | |
| 2003/0191783 A1 | 10/2003 | Wolczko et al. | |
| 2003/0225961 A1 | 12/2003 | Chow et al. | |
| 2004/0080985 A1 | 4/2004 | Chang et al. | |
| 2004/0111573 A1 | 6/2004 | Garthwaite | |
| 2004/0153844 A1 | 8/2004 | Ghose et al. | |
| 2004/0193814 A1 | 9/2004 | Erickson et al. | |
| 2004/0260967 A1 | 12/2004 | Guha et al. | |
| 2005/0160416 A1 | 7/2005 | Jamison | |
| 2005/0188246 A1 | 8/2005 | Emberty et al. | |
| 2005/0216800 A1 | 9/2005 | Bicknell et al. | |
| 2006/0015771 A1 | 1/2006 | Van Gundy et al. | |
| 2006/0129817 A1 | 6/2006 | Borneman et al. | |
| 2006/0161726 A1 | 7/2006 | Lasser | |
| 2006/0230245 A1 | 10/2006 | Gounares et al. | |
| 2006/0239075 A1 | 10/2006 | Williams et al. | |
| 2007/0022227 A1 | 1/2007 | Miki | |
| 2007/0028068 A1 | 2/2007 | Golding et al. | |
| 2007/0055702 A1 | 3/2007 | Fridella et al. | |
| 2007/0109856 A1 | 5/2007 | Pellicone et al. | |
| 2007/0150645 A1* | 6/2007 | Chandramouli ..... | G11C 16/102 714/E11.138 |
| 2007/0150689 A1 | 6/2007 | Pandit et al. | |
| 2007/0168321 A1 | 7/2007 | Saito et al. | |
| 2007/0220227 A1 | 9/2007 | Long | |
| 2007/0233757 A1 | 10/2007 | Inai et al. | |
| 2007/0294563 A1 | 12/2007 | Bose | |
| 2007/0294564 A1 | 12/2007 | Reddin et al. | |
| 2008/0005587 A1 | 1/2008 | Ahlquist | |
| 2008/0019226 A1 | 1/2008 | Sasage et al. | |
| 2008/0046639 A1* | 2/2008 | Tsuji ................... | G06F 12/0207 711/103 |
| 2008/0077825 A1 | 3/2008 | Bello et al. | |
| 2008/0162674 A1 | 7/2008 | Dahiya | |
| 2008/0195833 A1 | 8/2008 | Park | |
| 2008/0270678 A1 | 10/2008 | Cornwell et al. | |
| 2008/0282045 A1 | 11/2008 | Biswas et al. | |
| 2009/0060197 A1 | 3/2009 | Taylor et al. | |
| 2009/0077340 A1 | 3/2009 | Johnson et al. | |
| 2009/0100115 A1 | 4/2009 | Park et al. | |
| 2009/0198889 A1 | 8/2009 | Ito et al. | |
| 2010/0052625 A1 | 3/2010 | Cagno et al. | |
| 2010/0061207 A1* | 3/2010 | Trantham ............... | G11B 27/36 369/53.1 |
| 2010/0211723 A1 | 8/2010 | Mukaida | |
| 2010/0246266 A1 | 9/2010 | Park et al. | |
| 2010/0257142 A1 | 10/2010 | Murphy et al. | |
| 2010/0262764 A1 | 10/2010 | Liu et al. | |
| 2010/0325345 A1 | 12/2010 | Ohno et al. | |
| 2010/0332754 A1 | 12/2010 | Lai et al. | |
| 2011/0047421 A1* | 2/2011 | Schuette ............... | G11C 16/349 714/718 |
| 2011/0063918 A1* | 3/2011 | Pei ....................... | G06F 11/1072 365/185.18 |
| 2011/0072290 A1 | 3/2011 | Davis et al. | |
| 2011/0125955 A1 | 5/2011 | Chen | |
| 2011/0131231 A1 | 6/2011 | Haas et al. | |
| 2011/0167221 A1 | 7/2011 | Pangal et al. | |
| 2011/0173484 A1* | 7/2011 | Schuette ............. | G06F 11/0727 714/2 |
| 2011/0231730 A1* | 9/2011 | Allen ................... | G06F 11/106 714/758 |
| 2011/0246733 A1 | 10/2011 | Usgaonkar et al. | |
| 2012/0023144 A1 | 1/2012 | Rub | |
| 2012/0054264 A1 | 3/2012 | Haugh et al. | |
| 2012/0079318 A1 | 3/2012 | Colgrove et al. | |
| 2012/0117312 A1 | 5/2012 | Chan et al. | |
| 2012/0131253 A1 | 5/2012 | McKnight et al. | |
| 2012/0185638 A1* | 7/2012 | Schreiber ............. | G06F 16/122 711/103 |
| 2012/0303919 A1 | 11/2012 | Hu et al. | |
| 2012/0311000 A1 | 12/2012 | Post et al. | |
| 2013/0007845 A1 | 1/2013 | Chang et al. | |
| 2013/0031414 A1 | 1/2013 | Dhuse et al. | |
| 2013/0036272 A1 | 2/2013 | Nelson | |
| 2013/0071087 A1 | 3/2013 | Motiwala et al. | |
| 2013/0086006 A1 | 4/2013 | Colgrove et al. | |
| 2013/0145447 A1 | 6/2013 | Maron | |
| 2013/0191555 A1 | 7/2013 | Liu | |
| 2013/0198459 A1 | 8/2013 | Joshi et al. | |
| 2013/0205173 A1 | 8/2013 | Yoneda | |
| 2013/0219164 A1 | 8/2013 | Hamid | |
| 2013/0227201 A1 | 8/2013 | Talagala et al. | |

(56) References Cited

U.S. PATENT DOCUMENTS

| | | |
|---|---|---|
| 2013/0262738 A1 | 10/2013 | Kwon et al. |
| 2013/0290607 A1 | 10/2013 | Chang et al. |
| 2013/0311434 A1 | 11/2013 | Jones |
| 2013/0318297 A1 | 11/2013 | Jibbe et al. |
| 2013/0332614 A1 | 12/2013 | Brunk et al. |
| 2014/0020083 A1 | 1/2014 | Fetik |
| 2014/0032822 A1* | 1/2014 | Oh .................. G06F 12/0246 |
| | | 711/103 |
| 2014/0032834 A1 | 1/2014 | Cudak et al. |
| 2014/0074850 A1 | 3/2014 | Noel et al. |
| 2014/0082031 A1* | 3/2014 | Chun ................. G06F 16/1847 |
| | | 707/824 |
| 2014/0082715 A1 | 3/2014 | Grajek et al. |
| 2014/0086146 A1 | 3/2014 | Kim et al. |
| 2014/0090009 A1 | 3/2014 | Li et al. |
| 2014/0096220 A1 | 4/2014 | Da Cruz Pinto et al. |
| 2014/0101434 A1 | 4/2014 | Senthurpandi et al. |
| 2014/0164774 A1 | 6/2014 | Nord et al. |
| 2014/0173232 A1 | 6/2014 | Reohr et al. |
| 2014/0195636 A1 | 7/2014 | Karve et al. |
| 2014/0201512 A1 | 7/2014 | Seethaler et al. |
| 2014/0201541 A1 | 7/2014 | Paul et al. |
| 2014/0208155 A1 | 7/2014 | Pan |
| 2014/0215590 A1 | 7/2014 | Brand |
| 2014/0229654 A1 | 8/2014 | Goss et al. |
| 2014/0230017 A1 | 8/2014 | Saib |
| 2014/0258526 A1 | 9/2014 | Le Sant et al. |
| 2014/0282983 A1 | 9/2014 | Ju et al. |
| 2014/0285917 A1 | 9/2014 | Cudak et al. |
| 2014/0325262 A1 | 10/2014 | Cooper et al. |
| 2014/0351627 A1 | 11/2014 | Best et al. |
| 2014/0373104 A1 | 12/2014 | Gaddam et al. |
| 2014/0373126 A1 | 12/2014 | Hussain et al. |
| 2015/0026387 A1 | 1/2015 | Sheredy et al. |
| 2015/0074463 A1 | 3/2015 | Jacoby et al. |
| 2015/0089569 A1 | 3/2015 | Sondhi et al. |
| 2015/0095515 A1 | 4/2015 | Krithivas et al. |
| 2015/0113203 A1 | 4/2015 | Dancho et al. |
| 2015/0121137 A1 | 4/2015 | McKnight et al. |
| 2015/0134920 A1 | 5/2015 | Anderson et al. |
| 2015/0143037 A1 | 5/2015 | Smith |
| 2015/0149822 A1 | 5/2015 | Coronado et al. |
| 2015/0186072 A1* | 7/2015 | Darragh ............. G11C 16/3495 |
| | | 711/103 |
| 2015/0193169 A1 | 7/2015 | Sundaram et al. |
| 2015/0205657 A1* | 7/2015 | Clark ................. G06F 11/008 |
| | | 714/47.3 |
| 2015/0261720 A1 | 9/2015 | Kagan et al. |
| 2015/0278046 A1 | 10/2015 | Zellermayer et al. |
| 2015/0309736 A1 | 10/2015 | Baskakov et al. |
| 2015/0339070 A1* | 11/2015 | Lee .................. G06F 3/0619 |
| | | 711/103 |
| 2015/0378888 A1 | 12/2015 | Zhang et al. |
| 2016/0011818 A1 | 1/2016 | Hashimoto et al. |
| 2016/0034206 A1* | 2/2016 | Ryan ................. G11C 16/349 |
| | | 711/103 |
| 2016/0098323 A1 | 4/2016 | Mutha et al. |
| 2016/0196076 A1* | 7/2016 | Oh .................. G06F 12/1009 |
| | | 711/103 |
| 2016/0313944 A1* | 10/2016 | Hodgdon ............. G06F 3/061 |
| 2016/0350009 A1 | 12/2016 | Cerreta et al. |
| 2016/0352720 A1 | 12/2016 | Hu et al. |
| 2016/0352830 A1 | 12/2016 | Borowiec et al. |
| 2016/0352834 A1 | 12/2016 | Borowiec et al. |
| 2017/0003880 A1* | 1/2017 | Fisher ............... G06F 3/0655 |
| 2018/0018096 A1 | 1/2018 | Fekete et al. |
| 2018/0081562 A1 | 3/2018 | Vasudevan |
| 2020/0326871 A1* | 10/2020 | Wu .................. G06F 3/0647 |

FOREIGN PATENT DOCUMENTS

| | | |
|---|---|---|
| EP | 3400522 A1 | 11/2018 |
| WO | WO-2012/087648 A1 | 6/2012 |
| WO | WO-2013071087 A1 | 5/2013 |
| WO | WO-2014/110137 A1 | 7/2014 |
| WO | WO-2016/015008 A1 | 12/2016 |
| WO | WO-2016/190938 A1 | 12/2016 |
| WO | WO-2016/195759 A1 | 12/2016 |
| WO | WO-2016/195958 A1 | 12/2016 |
| WO | WO-2016/195961 A1 | 12/2016 |
| WO | WO-2017/189058 A1 | 11/2017 |

OTHER PUBLICATIONS

PCMag, *Storage Array Definition*, Published May 10, 2013. <http://web.archive.org/web/20130510121646/http://www.pcmag.com/encyclopedia/term/52091/storage-array>, 2 pages.

Google Search of "storage array define" performed by the Examiner on Nov. 4, 2015 for U.S. Appl. No. 14/725,278, Results limited to entries dated before 2012, 1 page.

Techopedia, *What is a disk array*, techopedia.com (online), Jan. 13, 2012, 1 page, URL: web.archive.org/web/20120113053358/http://www.techopedia.com/definition/1009/disk-array.

Webopedia, *What is a disk array*, webopedia.com (online), May 26, 2011, 2 pages, URL: web/archive.org/web/20110526081214/http://www.webopedia.com/TERM/D/disk_array.html.

Li et al., *Access Control for the Services Oriented Architecture*, Proceedings of the 2007 ACM Workshop on Secure Web Services (SWS '07), Nov. 2007, pp. 9-17, ACM New York, NY.

Hota et al., *Capability-based Cryptographic Data Access Control in Cloud Computing*, International Journal of Advanced Networking and Applications, col. 1, Issue 1, Aug. 2011, 10 pages, Eswar Publications, India.

Faith, *dictzip file format*, GitHub.com (online), accessed Jul. 28, 2015, 1 page, URL: github.com/fidlej/idzip.

Wikipedia, *Convergent Encryption*, Wikipedia.org (online), accessed Sep. 8, 2015, 2 pages, URL: en.wikipedia.org/wiki/Convergent_encryption.

Storer et al., *Secure Data Deduplication*, Proceedings of the 4th ACM International Workshop on Storage Security and Survivability (StorageSS'08), Oct. 2008, 10 pages, ACM New York, NY. USA, DOI: 10.1145/1456469.1456471.

ETSI, *Network Function Virtualisation (NFV); Resiliency Requirements*, ETSI GS NFCV-REL 001, V1.1.1, Jan. 2015, 82 pages, etsi.org (online), URL: www.etsi.org/deliver/etsi_gs/NFV-REL/001_099/001/01.01.01_60/gs_NFV-REL001v010101p.pdf.

Microsoft, *Hybrid for SharePoint Server 2013—Security Reference Architecture*, Microsoft (online), Oct. 2014, 53 pages, URL: hybrid.office.com/img/Security_Reference_Architecture.pdf.

Microsoft, *Hybrid Identity*, Microsoft (online), Apr. 2014, 36 pages, URL: www.aka.ms/HybridIdentityWp.

Microsoft, *Hybrid Identity Management*, Microsoft (online), Apr. 2014, 17 pages, URL: download.microsoft.com/download/E/A/E/EAE57CD1-A80B-423C-96BB-142FAAC630B9/Hybrid_Identity_Datasheet.pdf.

Bellamy-McIntyre et al., *OpenID and the Enterprise: A Model-based Analysis of Single Sign-On Authentication*, 15th IEEE International Enterprise Distributed Object Computing Conference (EDOC), Aug. 29, 2011, pp. 129-138, IEEE Computer Society, USA, DOI: 10.1109/EDOC.2011.26, ISBN: 978-1-4577-0362-1.

Kong, *Using PCI Express as the Primary System Interconnect in Multiroot Compute, Storage, Communications and Embedded Systems*, White Paper, IDT.com (online), Aug. 28, 2008, 12 pages, URL: www.idt.com/document/whp/idt-pcie-multi-root-whitepaper.

Hu et al., *Container Marking: Combining Data Placement, Garbage Collection and Wear Levelling for Flash*, 19th Annual IEEE International Symposium on Modelling, Analysis, and Simulation of Computer and Telecommunications Systems, Jul. 25-27, 2011, 11 pages, ISBN: 978-0-7695-4430-4, DOI: 10.1109/MASCOTS.2011.50.

International Search Report and Written Opinion, PCT/US2016/015006, dated Jul. 18, 2016, 12 pages.

International Search Report and Written Opinion, PCT/US2016/015008, dated May 4, 2016, 12 pages.

International Search Report and Written Opinion, PCT/US2016/020410, dated Jul. 8, 2016, 12 pages.

(56) References Cited

OTHER PUBLICATIONS

International Search Report and Written Opinion, PCT/US2016/032084, dated Jul. 18, 2016, 12 pages.
International Search Report and Written Opinion, PCT/US2016/016333, dated Jun. 8, 2016, 12 pages.
International Search Report and Written Opinion, PCT/US2016/032052, dated Aug. 30, 2016, 17 pages.
International Search Report and Written Opinion, PCT/US2016/035492, dated Aug. 17, 2016, 10 pages.
International Search Report and Written Opinion, PCT/US2016/036693, dated Aug. 29, 2016, 10 pages.
International Search Report and Written Opinion, PCT/US2016/038758, dated Oct. 7, 2016, 10 pages.
International Search Report and Written Opinion, PCT/US2016/040393, dated Sep. 22, 2016, 10 pages.
International Search Report and Written Opinion, PCT/US2016/044020, dated Sep. 30, 2016, 11 pages.
International Search Report and Written Opinion, PCT/US2016/044874, dated Oct. 7, 2016, 11 pages.
International Search Report and Written Opinion, PCT/US2016/044875, dated Oct. 5, 2016, 13 pages.
International Search Report and Written Opinion, PCT/US2016/044876, dated Oct. 21, 2016, 12 pages.
International Search Report and Written Opinion, PCT/US2016/044877, dated Sep. 29, 2016, 13 pages.
International Search Report and Written Opinion, PCT/US2017/012444, dated Apr. 7, 2017, 11 pages.

* cited by examiner

Storage System 402

Detect An Occurrence Of A Storage Device Evacuation Event Associated With One Or More Source Storage Devices 404

↓

Responsive To Detecting The Occurrence Of The Storage Device Evacuation Event, Identify One Or More Target Storage Devices For Receiving Data Stored On The One Or More Source Storage Devices 406

↓

Reduce Write Access To The One Or More Source Storage Devices 408

↓

Migrate The Data Stored On The One Or More Source Storage Devices To The One Or More Target Storage Devices 410

Source Storage Device 412
Data 416

Target Storage Device 414

PREDICTING FAILURES IN A STORAGE SYSTEM THAT INCLUDES A PLURALITY OF STORAGE DEVICES

CROSS-REFERENCE TO RELATED APPLICATIONS

This application is a continuation in part of U.S. patent application Ser. No. 15/786,187, filed Oct. 17, 2017, which is a continuation of U.S. Pat. No. 9,841,921, issued Dec. 12, 2017.

BACKGROUND

Technical Field

The field of the invention is data processing, or, more specifically, methods, apparatus, and products for migrating data in a storage array that includes a plurality of storage devices.

Background Art

Modern storage systems can include many storage devices. As storage technology advances and a particular storage system ages, the storage devices that are included within the particular storage system may become less efficient than their more modern counterparts in terms of power consumption, response times, storage density, and other measures. As such, a system administrator or other user of the particular storage system may find it desirable to upgrade the storage devices that are included within the particular storage system.

SUMMARY OF INVENTION

Methods, apparatuses, and products for migrating data in a storage array that includes a plurality of storage devices, including: detecting, by the storage array, an occurrence of a storage device evacuation event associated with one or more source storage devices; responsive to detecting the occurrence of the storage device evacuation event, identifying, by the storage array, one or more target storage devices for receiving data stored on the one or more source storage devices; reducing, by the storage array, write access to the one or more source storage devices; and migrating the data stored on the one or more source storage devices to the one or more target storage devices.

The foregoing and other objects, features and advantages of the invention will be apparent from the following more particular descriptions of example embodiments of the invention as illustrated in the accompanying drawings wherein like reference numbers generally represent like parts of example embodiments of the invention.

BRIEF DESCRIPTION OF DRAWINGS

FIG. 4 sets forth a flow chart illustrating an example method for migrating data in a storage array that includes a plurality of storage devices according to embodiments of the present disclosure.

DESCRIPTION OF EMBODIMENTS

Figure 1A:
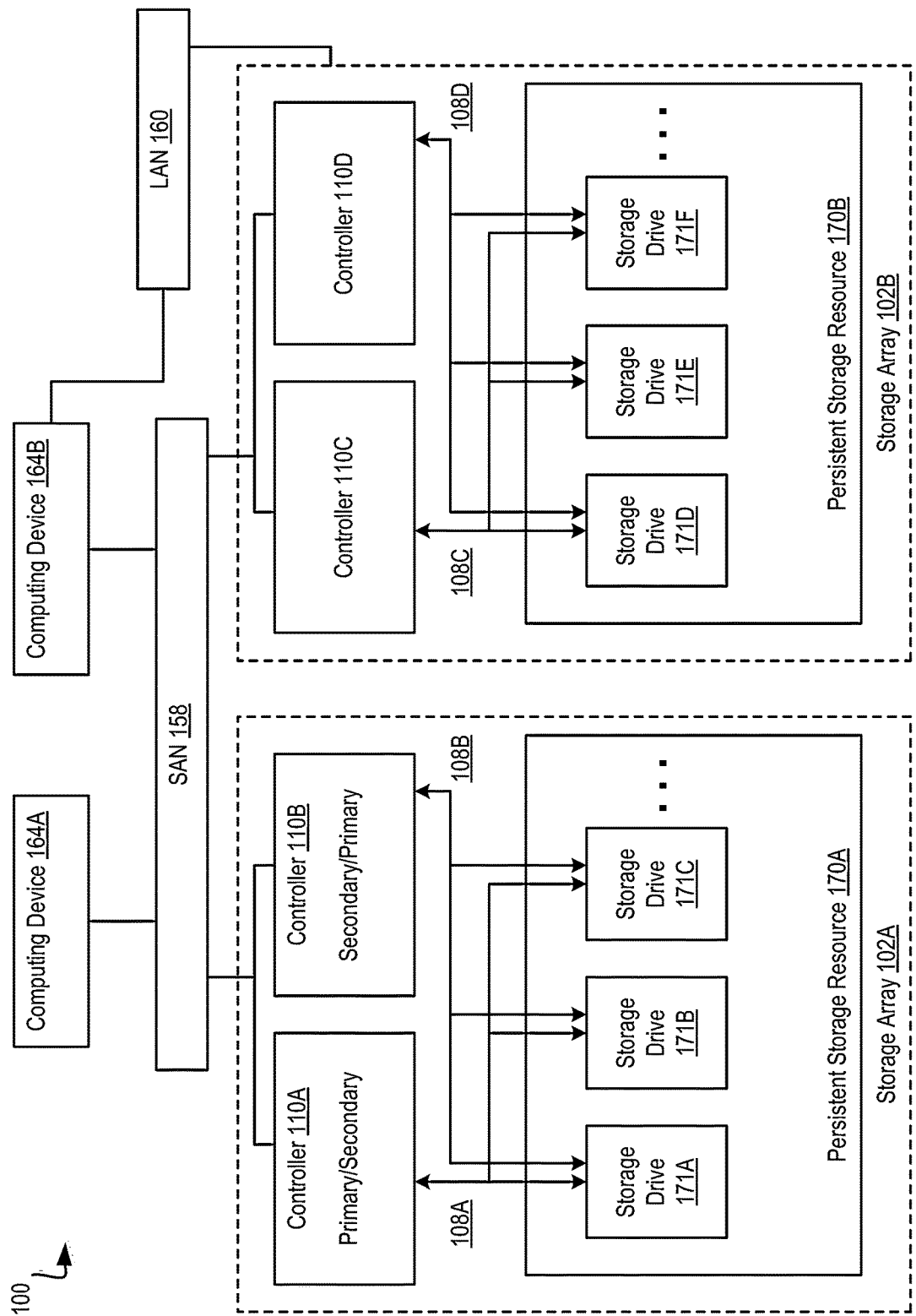
FIG. 1A illustrates a first example system for data storage in accordance with some implementations.

Example methods, apparatus, and products for migrating data in a storage array that includes a plurality of storage devices in accordance with the present invention are described with reference to the accompanying drawings, beginning with FIG. 1. FIG. 1A illustrates an example system for data storage, in accordance with some implementations. System 100 (also referred to as "storage system" herein) includes numerous elements for purposes of illustration rather than limitation. It may be noted that system 100 may include the same, more, or fewer elements configured in the same or different manner in other implementations.

System 100 includes a number of computing devices 164A-B. Computing devices (also referred to as "client devices" herein) may be embodied, for example, a server in a data center, a workstation, a personal computer, a notebook, or the like. Computing devices 164A-B may be coupled for data communications to one or more storage arrays 102A-B through a storage area network ('SAN') 158 or a local area network ('LAN') 160.

The SAN 158 may be implemented with a variety of data communications fabrics, devices, and protocols. For example, the fabrics for SAN 158 may include Fibre Channel, Ethernet, Infiniband, Serial Attached Small Computer System Interface ('SAS'), or the like. Data communications protocols for use with SAN 158 may include Advanced Technology Attachment ('ATA'), Fibre Channel Protocol, Small Computer System Interface ('SCSI'), Internet Small Computer System Interface ('iSCSI'), HyperSCSI, Non-Volatile Memory Express ('NVMe') over Fabrics, or the like. It may be noted that SAN 158 is provided for illustration, rather than limitation. Other data communication couplings may be implemented between computing devices 164A-B and storage arrays 102A-B.

The LAN 160 may also be implemented with a variety of fabrics, devices, and protocols. For example, the fabrics for LAN 160 may include Ethernet (802.3), wireless (802.11), or the like. Data communication protocols for use in LAN 160 may include Transmission Control Protocol ('TCP'), User Datagram Protocol ('UDP'), Internet Protocol (IF), HyperText Transfer Protocol ('HTTP'), Wireless Access Protocol ('WAP'), Handheld Device Transport Protocol ('HDTP'), Session Initiation Protocol ('SIP'), Real Time Protocol ('RTP'), or the like.

Storage arrays 102A-B may provide persistent data storage for the computing devices 164A-B. Storage array 102A may be contained in a chassis (not shown), and storage array 102B may be contained in another chassis (not shown), in implementations. Storage array 102A and 102B may include one or more storage array controllers 110 (also referred to as "controller" herein). A storage array controller 110 may be embodied as a module of automated computing machinery comprising computer hardware, computer software, or a combination of computer hardware and software. In some implementations, the storage array controllers 110 may be configured to carry out various storage tasks. Storage tasks may include writing data received from the computing devices 164A-B to storage array 102A-B, erasing data from storage array 102A-B, retrieving data from storage array 102A-B and providing data to computing devices 164A-B, monitoring and reporting of disk utilization and performance, performing redundancy operations, such as Redundant Array of Independent Drives (RAID') or RAID-like data redundancy operations, compressing data, encrypting data, and so forth.

Storage array controller 110 may be implemented in a variety of ways, including as a Field Programmable Gate Array ('FPGA'), a Programmable Logic Chip ('PLC'), an Application Specific Integrated Circuit ('ASIC'), System-on-Chip ('SOC'), or any computing device that includes discrete components such as a processing device, central processing unit, computer memory, or various adapters. Storage array controller 110 may include, for example, a data communications adapter configured to support communications via the SAN 158 or LAN 160. In some implementations, storage array controller 110 may be independently coupled to the LAN 160. In implementations, storage array controller 110 may include an I/O controller or the like that couples the storage array controller 110 for data communications, through a midplane (not shown), to a persistent storage resource 170A-B (also referred to as a "storage resource" herein). The persistent storage resource 170A-B main include any number of storage drives 171A-F (also referred to as "storage devices" herein) and any number of non-volatile Random Access Memory ('NVRAM') devices (not shown).

In some implementations, the NVRAM devices of a persistent storage resource 170A-B may be configured to receive, from the storage array controller 110, data to be stored in the storage drives 171A-F. In some examples, the data may originate from computing devices 164A-B. In some examples, writing data to the NVRAM device may be carried out more quickly than directly writing data to the storage drive 171A-F. In implementations, the storage array controller 110 may be configured to utilize the NVRAM devices as a quickly accessible buffer for data destined to be written to the storage drives 171A-F. Latency for write requests using NVRAM devices as a buffer may be improved relative to a system in which a storage array controller 110 writes data directly to the storage drives 171A-F. In some implementations, the NVRAM devices may be implemented with computer memory in the form of high bandwidth, low latency RAM. The NVRAM device is referred to as "non-volatile" because the NVRAM device may receive or include a unique power source that maintains the state of the RAM after main power loss to the NVRAM device. Such a power source may be a battery, one or more capacitors, or the like. In response to a power loss, the NVRAM device may be configured to write the contents of the RAM to a persistent storage, such as the storage drives 171A-F.

In implementations, storage drive 171A-F may refer to any device configured to record data persistently, where "persistently" or "persistent" refers as to a device's ability to maintain recorded data after loss of power. In some implementations, storage drive 171A-F may correspond to non-disk storage media. For example, the storage drive 171A-F may be one or more solid-state drives ('SSDs'), flash memory based storage, any type of solid-state non-volatile memory, or any other type of non-mechanical storage device. In other implementations, storage drive 171A-F may include may include mechanical or spinning hard disk, such as hard-disk drives ('HDD').

In some implementations, the storage array controllers 110 may be configured for offloading device management responsibilities from storage drive 171A-F in storage array 102A-B. For example, storage array controllers 110 may manage control information that may describe the state of one or more memory blocks in the storage drives 171A-F. The control information may indicate, for example, that a particular memory block has failed and should no longer be written to, that a particular memory block contains boot code for a storage array controller 110, the number of program-erase (PIE') cycles that have been performed on a particular memory block, the age of data stored in a particular memory block, the type of data that is stored in a particular memory block, and so forth. In some implementations, the control information may be stored with an associated memory block as metadata. In other implementations, the control information for the storage drives 171A-F may be stored in one or more particular memory blocks of the storage drives 171A-F that are selected by the storage array controller 110. The selected memory blocks may be tagged with an identifier indicating that the selected memory block contains control information. The identifier may be utilized by the storage array controllers 110 in conjunction with storage drives 171A-F to quickly identify the memory blocks that contain control information. For example, the storage controllers 110 may issue a command to locate memory blocks that contain control information. It may be noted that control information may be so large that parts of the control information may be stored in multiple locations, that the control information may be stored in multiple locations for purposes of redundancy, for example, or that the control information may otherwise be distributed across multiple memory blocks in the storage drive 171A-F.

In implementations, storage array controllers 110 may offload device management responsibilities from storage drives 171A-F of storage array 102A-B by retrieving, from the storage drives 171A-F, control information describing the state of one or more memory blocks in the storage drives 171A-F. Retrieving the control information from the storage drives 171A-F may be carried out, for example, by the storage array controller 110 querying the storage drives 171A-F for the location of control information for a particular storage drive 171A-F. The storage drives 171A-F may be configured to execute instructions that enable the storage drive 171A-F to identify the location of the control information. The instructions may be executed by a controller (not shown) associated with or otherwise located on the storage drive 171A-F and may cause the storage drive 171A-F to scan a portion of each memory block to identify the memory blocks that store control information for the storage drives 171A-F. The storage drives 171A-F may respond by sending a response message to the storage array controller 110 that includes the location of control information for the storage drive 171A-F. Responsive to receiving the response message, storage array controllers 110 may issue a request to read data stored at the address associated with the location of control information for the storage drives 171A-F.

In other implementations, the storage array controllers 110 may further offload device management responsibilities from storage drives 171A-F by performing, in response to receiving the control information, a storage drive management operation. A storage drive management operation may include, for example, an operation that is typically performed by the storage drive 171A-F (e.g., the controller (not shown) associated with a particular storage drive 171A-F). A storage drive management operation may include, for example, ensuring that data is not written to failed memory blocks within the storage drive 171A-F, ensuring that data is written to memory blocks within the storage drive 171A-F in such a way that adequate wear leveling is achieved, and so forth.

In implementations, storage array 102A-B may implement two or more storage array controllers 110. For example, storage array 102A may include storage array controllers 110A and storage array controllers 110B. At a given instance, a single storage array controller 110 (e.g., storage array controller 110A) of a storage system 100 may be designated with primary status (also referred to as "primary controller" herein), and other storage array controllers 110 (e.g., storage array controller 110A) may be designated with secondary status (also referred to as "secondary controller" herein). The primary controller may have particular rights, such as permission to alter data in persistent storage resource 170A-B (e.g., writing data to persistent storage resource 170A-B). At least some of the rights of the primary controller may supersede the rights of the secondary controller. For instance, the secondary controller may not have permission to alter data in persistent storage resource 170A-B when the primary controller has the right. The status of storage array controllers 110 may change. For example, storage array controller 110A may be designated with secondary status, and storage array controller 110B may be designated with primary status.

In some implementations, a primary controller, such as storage array controller 110A, may serve as the primary controller for one or more storage arrays 102A-B, and a second controller, such as storage array controller 110B, may serve as the secondary controller for the one or more storage arrays 102A-B. For example, storage array controller 110A may be the primary controller for storage array 102A and storage array 102B, and storage array controller 110B may be the secondary controller for storage array 102A and 102B. In some implementations, storage array controllers 110C and 110D (also referred to as "storage processing modules") may neither have primary or secondary status. Storage array controllers 110C and 110D, implemented as storage processing modules, may act as a communication interface between the primary and secondary controllers (e.g., storage array controllers 110A and 110B, respectively) and storage array 102B. For example, storage array controller 110A of storage array 102A may send a write request, via SAN 158, to storage array 102B. The write request may be received by both storage array controllers 110C and 110D of storage array 102B. Storage array controllers 110C and 110D facilitate the communication, e.g., send the write request to the appropriate storage drive 171A-F. It may be noted that in some implementations storage processing modules may be used to increase the number of storage drives controlled by the primary and secondary controllers.

In implementations, storage array controllers 110 are communicatively coupled, via a midplane (not shown), to one or more storage drives 171A-F and to one or more NVRAM devices (not shown) that are included as part of a storage array 102A-B. The storage array controllers 110 may be coupled to the midplane via one or more data communication links and the midplane may be coupled to the storage drives 171A-F and the NVRAM devices via one or more data communications links. The data communications links described herein are collectively illustrated by data communications links 108A-D and may include a Peripheral Component Interconnect Express ('PCIe') bus, for example.

Figure 1B:
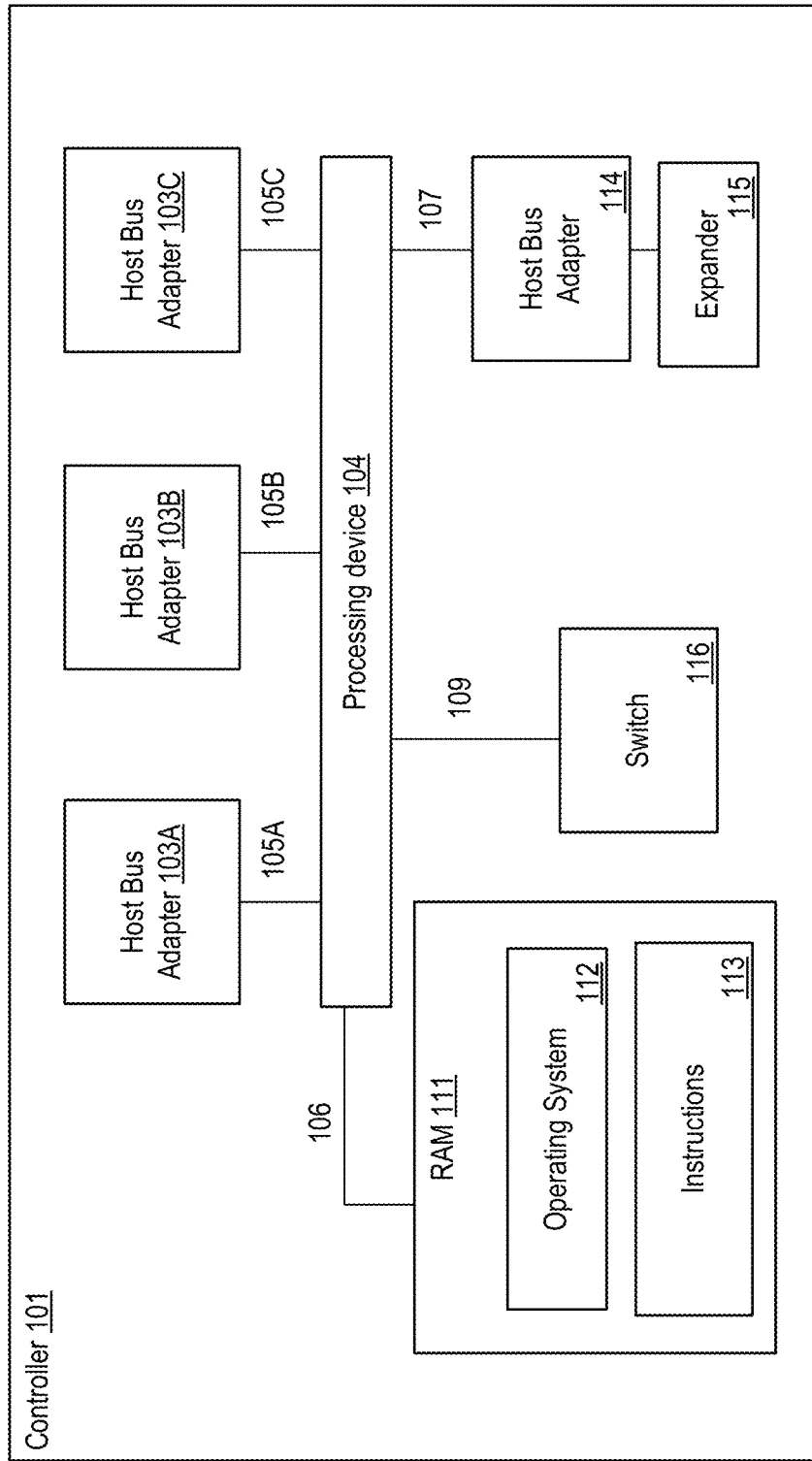
FIG. 1B illustrates a second example system for data storage in accordance with some implementations.

FIG. 1B illustrates an example system for data storage, in accordance with some implementations. Storage array controller 101 illustrated in FIG. 1B may similar to the storage array controllers 110 described with respect to FIG. 1A. In one example, storage array controller 101 may be similar to storage array controller 110A or storage array controller 110B. Storage array controller 101 includes numerous elements for purposes of illustration rather than limitation. It may be noted that storage array controller 101 may include the same, more, or fewer elements configured in the same or different manner in other implementations. It may be noted that elements of FIG. 1A may be included below to help illustrate features of storage array controller 101.

Storage array controller 101 may include one or more processing devices 104 and random access memory ('RAM') 111. Processing device 104 (or controller 101) represents one or more general-purpose processing devices such as a microprocessor, central processing unit, or the like. More particularly, the processing device 104 (or controller 101) may be a complex instruction set computing ('CISC')

microprocessor, reduced instruction set computing ('RISC') microprocessor, very long instruction word ('VLIW') microprocessor, or a processor implementing other instruction sets or processors implementing a combination of instruction sets. The processing device 104 (or controller 101) may also be one or more special-purpose processing devices such as an application specific integrated circuit ('ASIC'), a field programmable gate array ('FPGA'), a digital signal processor ('DSP'), network processor, or the like.

The processing device 104 may be connected to the RAM 111 via a data communications link 106, which may be embodied as a high speed memory bus such as a Double-Data Rate 4 ('DDR4') bus. Stored in RAM 111 is an operating system 112. In some implementations, instructions 113 are stored in RAM 111. Instructions 113 may include computer program instructions for performing operations in in a direct-mapped flash storage system. In one embodiment, a direct-mapped flash storage system is one that addresses data blocks within flash drives directly and without an address translation performed by the storage controllers of the flash drives.

In implementations, storage array controller 101 includes one or more host bus adapters 103A-C that are coupled to the processing device 104 via a data communications link 105A-C. In implementations, host bus adapters 103A-C may be computer hardware that connects a host system (e.g., the storage array controller) to other network and storage arrays. In some examples, host bus adapters 103A-C may be a Fibre Channel adapter that enables the storage array controller 101 to connect to a SAN, an Ethernet adapter that enables the storage array controller 101 to connect to a LAN, or the like. Host bus adapters 103A-C may be coupled to the processing device 104 via a data communications link 105A-C such as, for example, a PCIe bus.

In implementations, storage array controller 101 may include a host bus adapter 114 that is coupled to an expander 115. The expander 115 may be used to attach a host system to a larger number of storage drives. The expander 115 may, for example, be a SAS expander utilized to enable the host bus adapter 114 to attach to storage drives in an implementation where the host bus adapter 114 is embodied as a SAS controller.

In implementations, storage array controller 101 may include a switch 116 coupled to the processing device 104 via a data communications link 109. The switch 116 may be a computer hardware device that can create multiple endpoints out of a single endpoint, thereby enabling multiple devices to share a single endpoint. The switch 116 may, for example, be a PCIe switch that is coupled to a PCIe bus (e.g., data communications link 109) and presents multiple PCIe connection points to the midplane.

In implementations, storage array controller 101 includes a data communications link 107 for coupling the storage array controller 101 to other storage array controllers. In some examples, data communications link 107 may be a QuickPath Interconnect (QPI) interconnect.

A traditional storage system that uses traditional flash drives may implement a process across the flash drives that are part of the traditional storage system. For example, a higher level process of the storage system may initiate and control a process across the flash drives. However, a flash drive of the traditional storage system may include its own storage controller that also performs the process. Thus, for the traditional storage system, a higher level process (e.g., initiated by the storage system) and a lower level process (e.g., initiated by a storage controller of the storage system) may both be performed.

To resolve various deficiencies of a traditional storage system, operations may be performed by higher level processes and not by the lower level processes. For example, the flash storage system may include flash drives that do not include storage controllers that provide the process. Thus, the operating system of the flash storage system itself may initiate and control the process. This may be accomplished by a direct-mapped flash storage system that addresses data blocks within the flash drives directly and without an address translation performed by the storage controllers of the flash drives.

The operating system of the flash storage system may identify and maintain a list of allocation units across multiple flash drives of the flash storage system. The allocation units may be entire erase blocks or multiple erase blocks. The operating system may maintain a map or address range that directly maps addresses to erase blocks of the flash drives of the flash storage system.

Direct mapping to the erase blocks of the flash drives may be used to rewrite data and erase data. For example, the operations may be performed on one or more allocation units that include a first data and a second data where the first data is to be retained and the second data is no longer being used by the flash storage system. The operating system may initiate the process to write the first data to new locations within other allocation units and erasing the second data and marking the allocation units as being available for use for subsequent data. Thus, the process may only be performed by the higher level operating system of the flash storage system without an additional lower level process being performed by controllers of the flash drives.

Advantages of the process being performed only by the operating system of the flash storage system include increased reliability of the flash drives of the flash storage system as unnecessary or redundant write operations are not being performed during the process. One possible point of novelty here is the concept of initiating and controlling the process at the operating system of the flash storage system. In addition, the process can be controlled by the operating system across multiple flash drives. This is contrast to the process being performed by a storage controller of a flash drive.

A storage system can consist of two storage array controllers that share a set of drives for failover purposes, or it could consist of a single storage array controller that provides a storage service that utilizes multiple drives, or it could consist of a distributed network of storage array controllers each with some number of drives or some amount of Flash storage where the storage array controllers in the network collaborate to provide a complete storage service and collaborate on various aspects of a storage service including storage allocation and garbage collection.

Figure 1C:
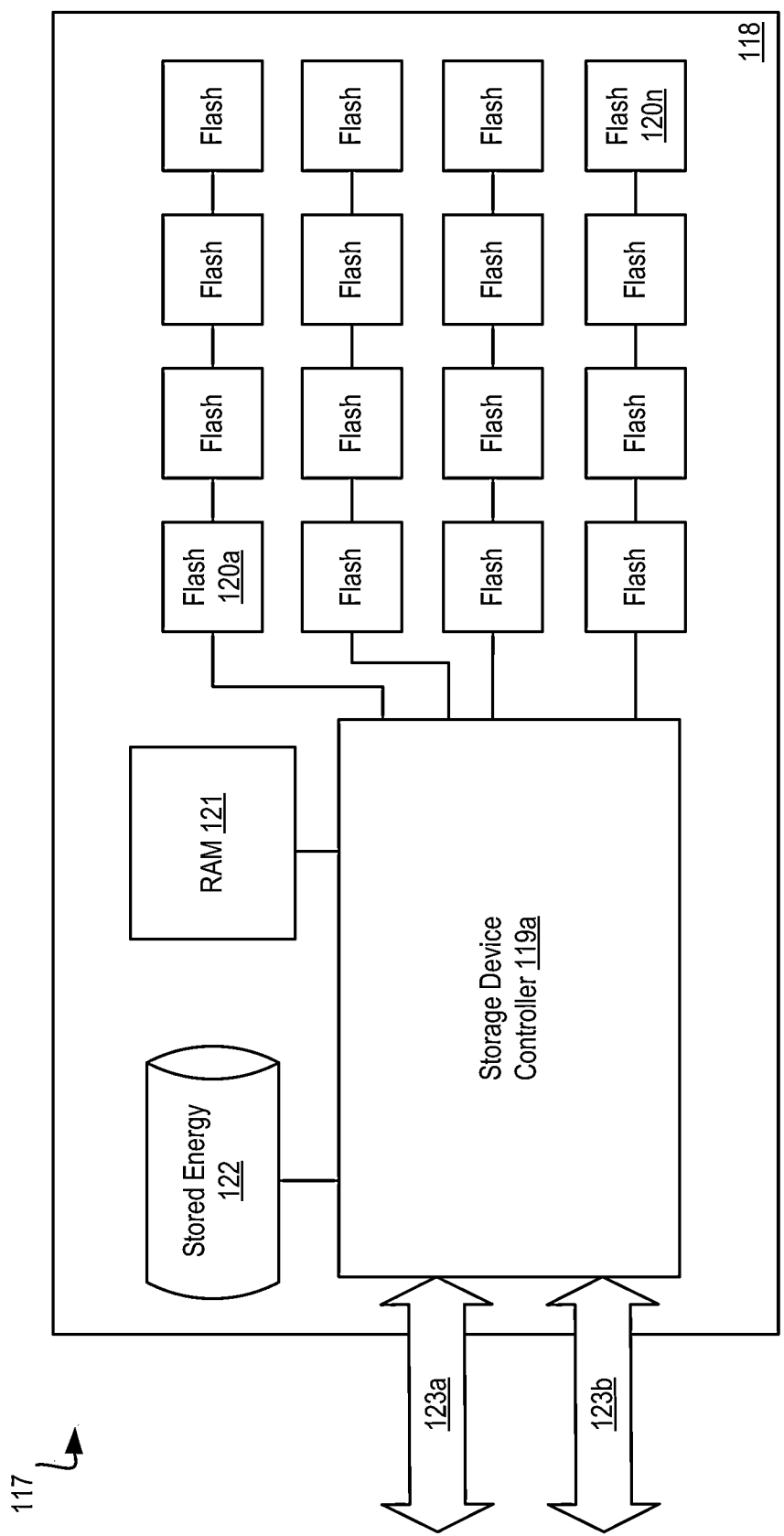
FIG. 1C illustrates a third example system for data storage in accordance with some implementations.

FIG. 1C illustrates a third example system 117 for data storage in accordance with some implementations. System 117 (also referred to as "storage system" herein) includes numerous elements for purposes of illustration rather than limitation. It may be noted that system 117 may include the same, more, or fewer elements configured in the same or different manner in other implementations.

In one embodiment, system 117 includes a dual Peripheral Component Interconnect ('PCI') flash storage device 118 with separately addressable fast write storage. System 117 may include a storage controller 119. In one embodiment, storage controller 119 may be a CPU, ASIC, FPGA, or any other circuitry that may implement control structures necessary according to the present disclosure. In one embodiment, system 117 includes flash memory devices (e.g., including flash memory devices 120a-n), operatively coupled to various channels of the storage device controller 119. Flash memory devices 120a-n, may be presented to the controller 119 as an addressable collection of Flash pages, erase blocks, and/or control elements sufficient to allow the storage device controller 119 to program and retrieve various aspects of the Flash. In one embodiment, storage device controller 119 may perform operations on flash memory devices 120a-n including storing and retrieving data content of pages, arranging and erasing any blocks, tracking statistics related to the use and reuse of Flash memory pages, erase blocks, and cells, tracking and predicting error codes and faults within the Flash memory, controlling voltage levels associated with programming and retrieving contents of Flash cells, etc.

In one embodiment, system 117 may include RAM 121 to store separately addressable fast-write data. In one embodiment, RAM 121 may be one or more separate discrete devices. In another embodiment, RAM 121 may be integrated into storage device controller 119 or multiple storage device controllers. The RAM 121 may be utilized for other purposes as well, such as temporary program memory for a processing device (e.g., a CPU) in the storage device controller 119.

In one embodiment, system 117 may include a stored energy device 122, such as a rechargeable battery or a capacitor. Stored energy device 122 may store energy sufficient to power the storage device controller 119, some amount of the RAM (e.g., RAM 121), and some amount of Flash memory (e.g., Flash memory 120a-120n) for sufficient time to write the contents of RAM to Flash memory. In one embodiment, storage device controller 119 may write the contents of RAM to Flash Memory if the storage device controller detects loss of external power.

In one embodiment, system 117 includes two data communications links 123a, 123b. In one embodiment, data communications links 123a, 123b may be PCI interfaces. In another embodiment, data communications links 123a, 123b may be based on other communications standards (e.g., HyperTransport, InfiniBand, etc.). Data communications links 123a, 123b may be based on non-volatile memory express ('NVMe') or NVMe over fabrics ('NVMf') specifications that allow external connection to the storage device controller 119 from other components in the storage system 117. It should be noted that data communications links may be interchangeably referred to herein as PCI buses for convenience.

System 117 may also include an external power source (not shown), which may be provided over one or both data communications links 123a, 123b, or which may be provided separately. An alternative embodiment includes a separate Flash memory (not shown) dedicated for use in storing the content of RAM 121. The storage device controller 119 may present a logical device over a PCI bus which may include an addressable fast-write logical device, or a distinct part of the logical address space of the storage device 118, which may be presented as PCI memory or as persistent storage. In one embodiment, operations to store into the device are directed into the RAM 121. On power failure, the storage device controller 119 may write stored content associated with the addressable fast-write logical storage to Flash memory (e.g., Flash memory 120a-n) for long-term persistent storage.

In one embodiment, the logical device may include some presentation of some or all of the content of the Flash memory devices 120a-n, where that presentation allows a storage system including a storage device 118 (e.g., storage system 117) to directly address Flash memory pages and directly reprogram erase blocks from storage system components that are external to the storage device through the PCI bus. The presentation may also allow one or more of the external components to control and retrieve other aspects of the Flash memory including some or all of: tracking statistics related to use and reuse of Flash memory pages, erase blocks, and cells across all the Flash memory devices; tracking and predicting error codes and faults within and across the Flash memory devices; controlling voltage levels associated with programming and retrieving contents of Flash cells; etc.

In one embodiment, the stored energy device 122 may be sufficient to ensure completion of in-progress operations to the Flash memory devices 120a-120n stored energy device 122 may power storage device controller 119 and associated Flash memory devices (e.g., 120a-n) for those operations, as well as for the storing of fast-write RAM to Flash memory. Stored energy device 122 may be used to store accumulated statistics and other parameters kept and tracked by the Flash memory devices 120a-n and/or the storage device controller 119. Separate capacitors or stored energy devices (such as smaller capacitors near or embedded within the Flash memory devices themselves) may be used for some or all of the operations described herein.

Various schemes may be used to track and optimize the life span of the stored energy component, such as adjusting voltage levels over time, partially discharging the storage energy device 122 to measure corresponding discharge characteristics, etc. If the available energy decreases over time, the effective available capacity of the addressable fast-write storage may be decreased to ensure that it can be written safely based on the currently available stored energy.

Figure 1D:
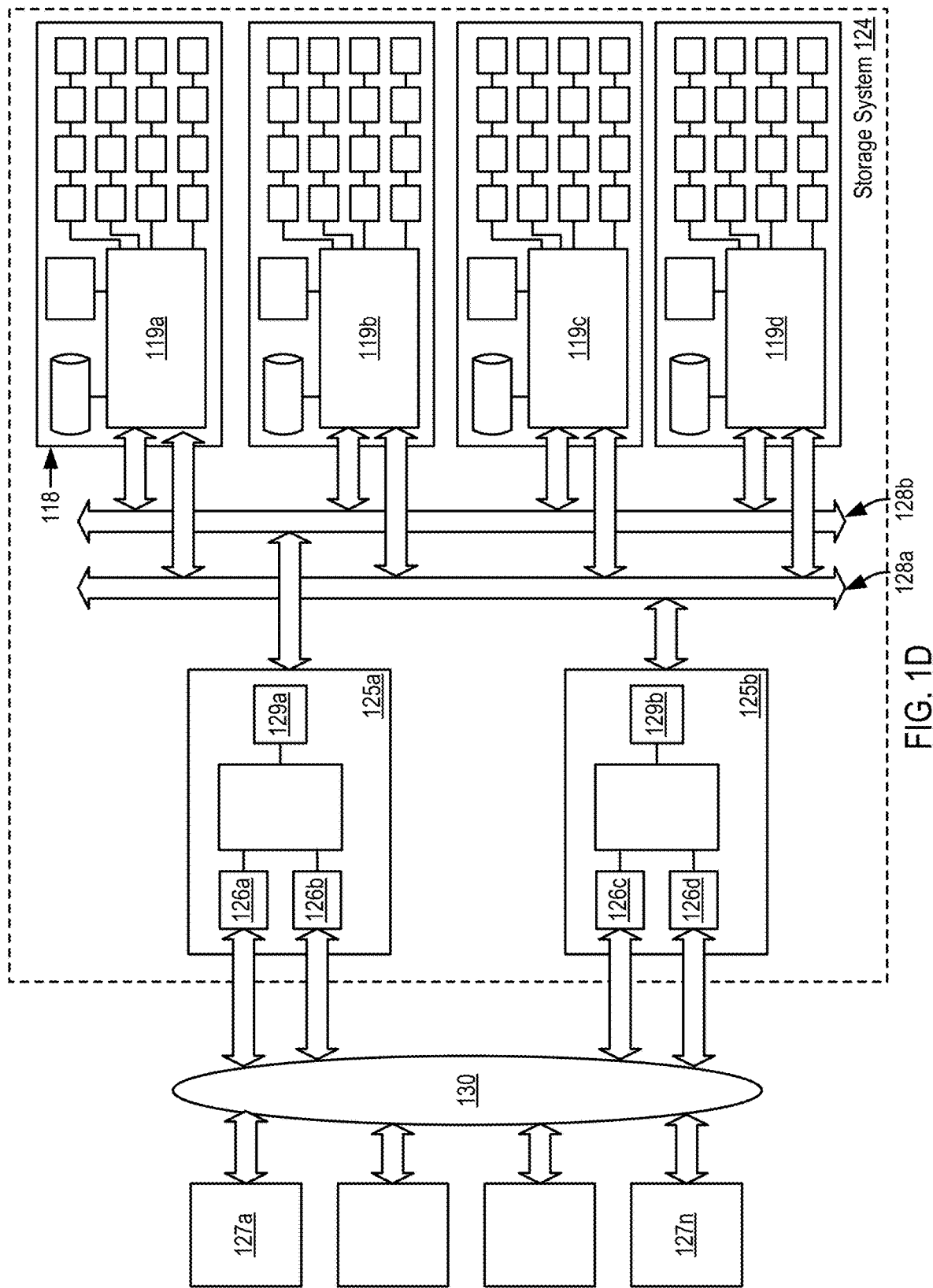
FIG. 1D illustrates a fourth example system for data storage in accordance with some implementations.

FIG. 1D illustrates a third example system 124 for data storage in accordance with some implementations. In one embodiment, system 124 includes storage controllers 125a, 125b. In one embodiment, storage controllers 125a, 125b are operatively coupled to Dual PCI storage devices 119a, 119b and 119c, 119d, respectively. Storage controllers 125a, 125b may be operatively coupled (e.g., via a storage network 130) to some number of host computers 127a-n.

In one embodiment, two storage controllers (e.g., 125a and 125b) provide storage services, such as a SCS) block storage array, a file server, an object server, a database or data analytics service, etc. The storage controllers 125a, 125b may provide services through some number of network interfaces (e.g., 126a-d) to host computers 127a-n outside of the storage system 124. Storage controllers 125a, 125b may provide integrated services or an application entirely within the storage system 124, forming a converged storage and compute system. The storage controllers 125a, 125b may utilize the fast write memory within or across storage devices 119a-d to journal in progress operations to ensure the operations are not lost on a power failure, storage controller removal, storage controller or storage system shutdown, or some fault of one or more software or hardware components within the storage system 124.

In one embodiment, controllers 125a, 125b operate as PCI masters to one or the other PCI buses 128a, 128b. In another embodiment, 128a and 128b may be based on other communications standards (e.g., HyperTransport, InfiniBand, etc.). Other storage system embodiments may operate storage controllers 125a, 125b as multi-masters for both PCI buses 128*a*, 128*b*. Alternately, a PCI/NVMe/NVMf switching infrastructure or fabric may connect multiple storage controllers. Some storage system embodiments may allow storage devices to communicate with each other directly rather than communicating only with storage controllers. In one embodiment, a storage device controller 119*a* may be operable under direction from a storage controller 125*a* to synthesize and transfer data to be stored into Flash memory devices from data that has been stored in RAM (e.g., RAM 121 of FIG. 1C). For example, a recalculated version of RAM content may be transferred after a storage controller has determined that an operation has fully committed across the storage system, or when fast-write memory on the device has reached a certain used capacity, or after a certain amount of time, to ensure improve safety of the data or to release addressable fast-write capacity for reuse. This mechanism may be used, for example, to avoid a second transfer over a bus (e.g., 128*a*, 128*b*) from the storage controllers 125*a*, 125*b*. In one embodiment, a recalculation may include compressing data, attaching indexing or other metadata, combining multiple data segments together, performing erasure code calculations, etc.

In one embodiment, under direction from a storage controller 125*a*, 125*b*, a storage device controller 119*a*, 119*b* may be operable to calculate and transfer data to other storage devices from data stored in RAM (e.g., RAM 121 of FIG. 1C) without involvement of the storage controllers 125*a*, 125*b*. This operation may be used to mirror data stored in one controller 125*a* to another controller 125*b*, or it could be used to offload compression, data aggregation, and/or erasure coding calculations and transfers to storage devices to reduce load on storage controllers or the storage controller interface 129*a*, 129*b* to the PCI bus 128*a*, 128*b*.

A storage device controller 119 may include mechanisms for implementing high availability primitives for use by other parts of a storage system external to the Dual PCI storage device 118. For example, reservation or exclusion primitives may be provided so that, in a storage system with two storage controllers providing a highly available storage service, one storage controller may prevent the other storage controller from accessing or continuing to access the storage device. This could be used, for example, in cases where one controller detects that the other controller is not functioning properly or where the interconnect between the two storage controllers may itself not be functioning properly.

In one embodiment, a storage system for use with Dual PCI direct mapped storage devices with separately addressable fast write storage includes systems that manage erase blocks or groups of erase blocks as allocation units for storing data on behalf of the storage service, or for storing metadata (e.g., indexes, logs, etc.) associated with the storage service, or for proper management of the storage system itself. Flash pages, which may be a few kilobytes in size, may be written as data arrives or as the storage system is to persist data for long intervals of time (e.g., above a defined threshold of time). To commit data more quickly, or to reduce the number of writes to the Flash memory devices, the storage controllers may first write data into the separately addressable fast write storage on one or more storage devices.

In one embodiment, the storage controllers 125*a*, 125*b* may initiate the use of erase blocks within and across storage devices (e.g., 118) in accordance with an age and expected remaining lifespan of the storage devices, or based on other statistics. The storage controllers 125*a*, 125*b* may initiate garbage collection and data migration between storage devices in accordance with pages that are no longer needed as well as to manage Flash page and erase block lifespans and to manage overall system performance.

In one embodiment, the storage system 124 may utilize mirroring and/or erasure coding schemes as part of storing data into addressable fast write storage and/or as part of writing data into allocation units associated with erase blocks. Erasure codes may be used across storage devices, as well as within erase blocks or allocation units, or within and across Flash memory devices on a single storage device, to provide redundancy against single or multiple storage device failures or to protect against internal corruptions of Flash memory pages resulting from Flash memory operations or from degradation of Flash memory cells. Mirroring and erasure coding at various levels may be used to recover from multiple types of failures that occur separately or in combination.

The embodiments depicted with reference to FIGS. 2A-G illustrate a storage cluster that stores user data, such as user data originating from one or more user or client systems or other sources external to the storage cluster. The storage cluster distributes user data across storage nodes housed within a chassis, or across multiple chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster may be contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as PCIe, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS'), common internet file system (CIF S'), small computer system interface (SCSI') or hypertext transfer protocol (HTTP'). Translation from the client protocol may occur at the switch, chassis external communication bus or within each storage node. In some embodiments, multiple chassis may be coupled or connected to each other through an aggregator switch. A portion and/or all of the coupled or connected chassis may be designated as a storage cluster. As discussed above, each chassis can have multiple blades, each blade has a media access control (MAC') address, but the storage cluster is presented to an external network as having a single cluster IP address and a single MAC address in some embodiments.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, DRAM and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded CPU, solid state storage controller, and a quantity of solid state mass storage, e.g., between 2-32 terabytes ('TB') in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM') that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

Figure 2A:
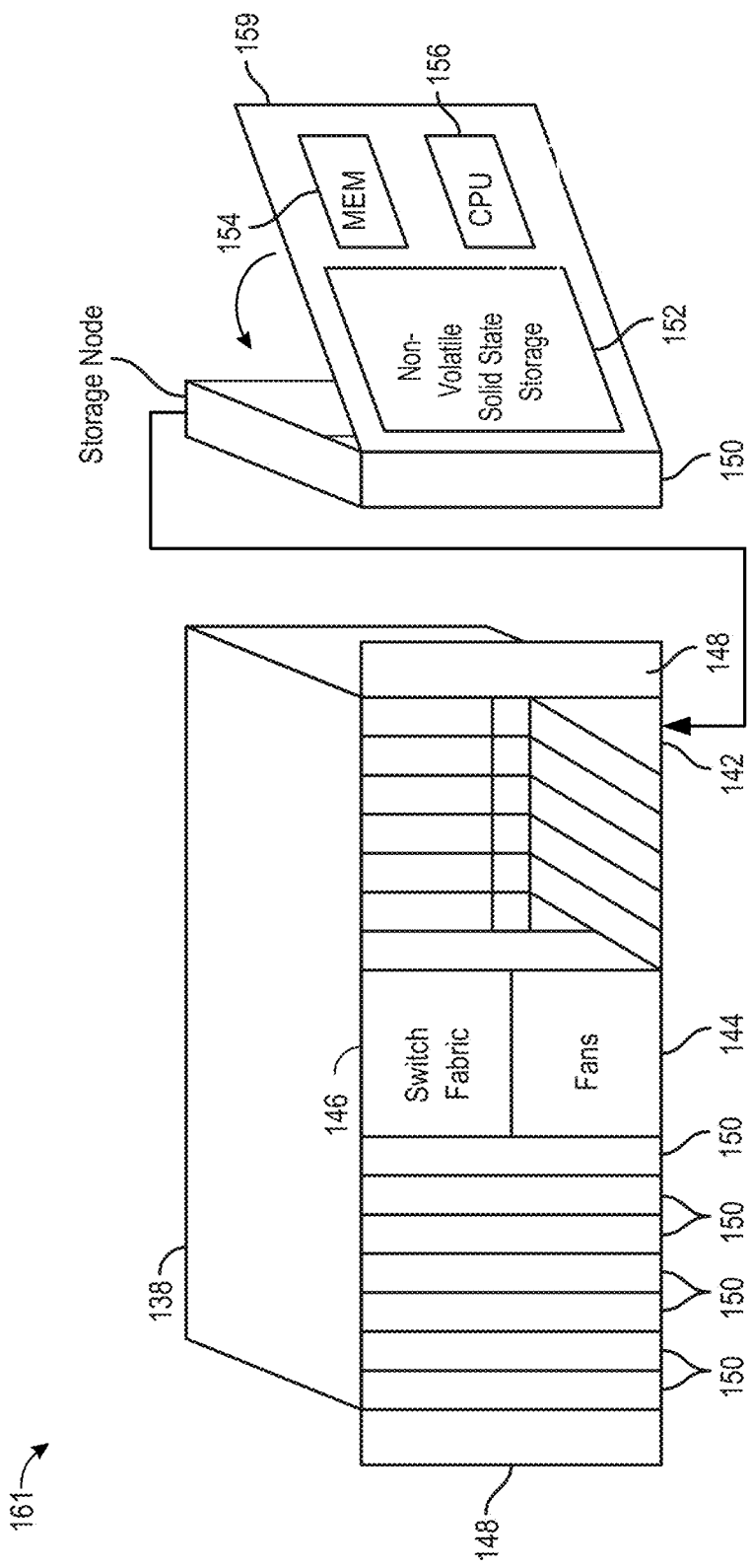
FIG. 2A is a perspective view of a storage cluster with multiple storage nodes and internal storage coupled to each storage node to provide network attached storage, in accordance with some embodiments.

FIG. 2A is a perspective view of a storage cluster 161, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 161, each having one or more storage nodes 150, in a flexible and reconfigurable arrangement of both the physical components and the amount of storage memory provided thereby. The storage cluster 161 is designed to fit in a rack, and one or more racks can be set up and populated as desired for the storage memory. The storage cluster 161 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in herein, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 159 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 2A, storage cluster 161 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2B:
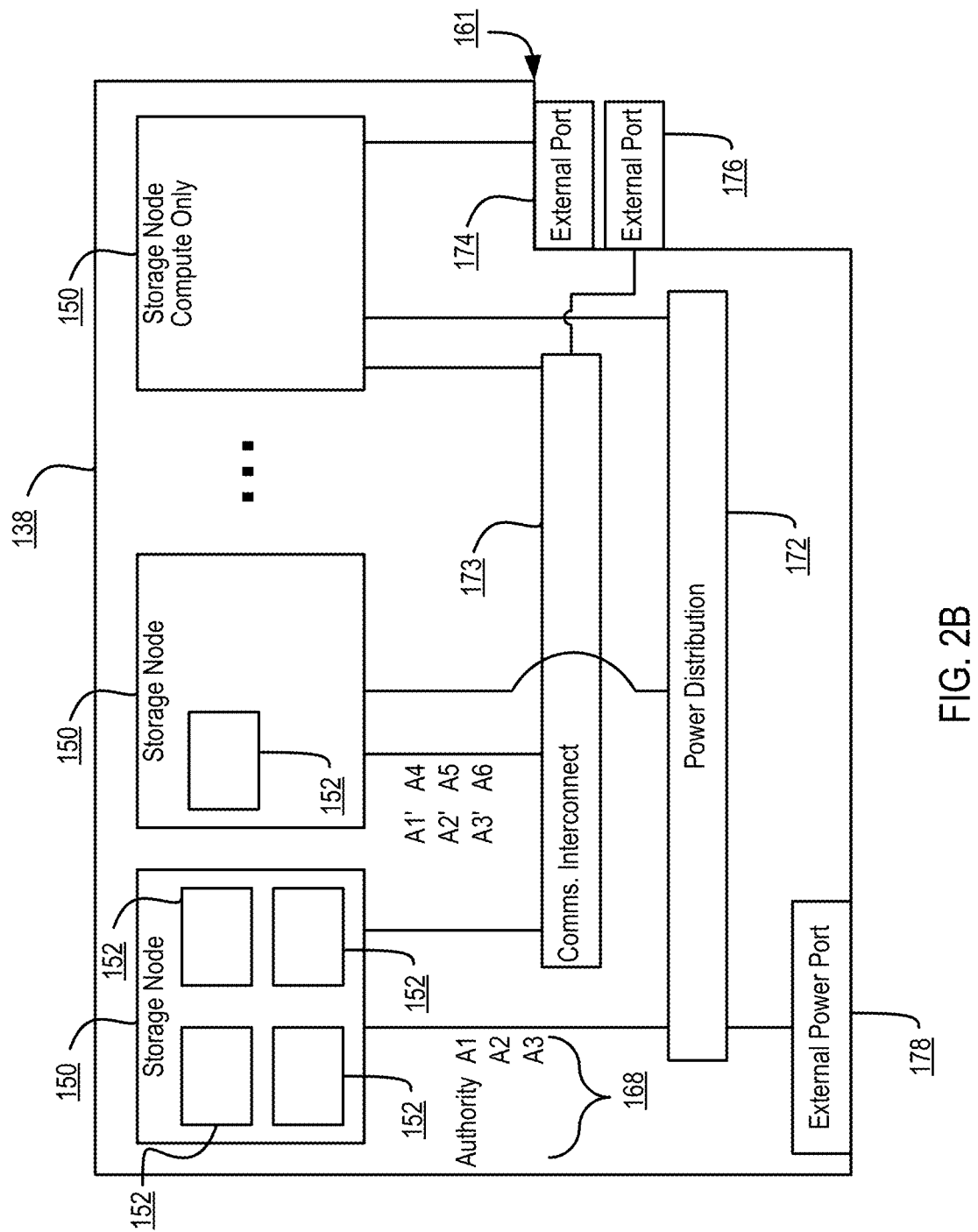
FIG. 2B is a block diagram showing an interconnect switch coupling multiple storage nodes in accordance with some embodiments.

FIG. 2B is a block diagram showing a communications interconnect 171A-F and power distribution bus 172 coupling multiple storage nodes 150. Referring back to FIG. 2A, the communications interconnect 171A-F can be included in or implemented with the switch fabric 146 in some embodiments. Where multiple storage clusters 161 occupy a rack, the communications interconnect 171A-F can be included in or implemented with a top of rack switch, in some embodiments. As illustrated in FIG. 2B, storage cluster 161 is enclosed within a single chassis 138. External port 176 is coupled to storage nodes 150 through communications interconnect 171A-F, while external port 174 is coupled directly to a storage node. External power port 178 is coupled to power distribution bus 172. Storage nodes 150 may include varying amounts and differing capacities of non-volatile solid state storage 152 as described with reference to FIG. 2A. In addition, one or more storage nodes 150 may be a compute only storage node as illustrated in FIG. 2B. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 2A and 2B, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIGS. 2E and 2G) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check ('IDPC') code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing ('RUSH') family of hashes, including Controlled Replication Under Scalable Hashing ('CRUSH'). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing, i.e., the system supports non-disruptive upgrades.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 2C:
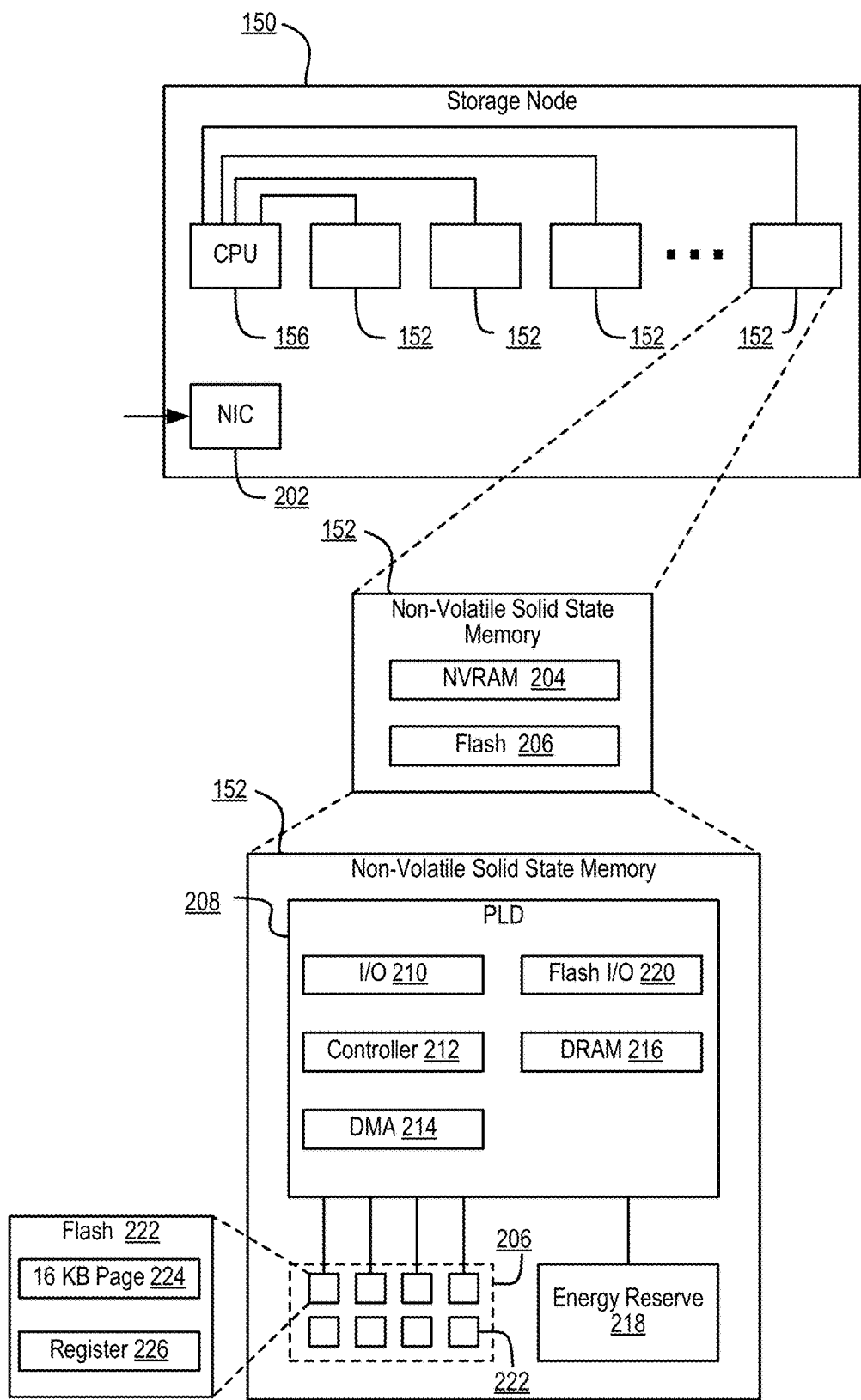
FIG. 2C is a multiple level block diagram, showing contents of a storage node and contents of one of the non-volatile solid state storage units in accordance with some embodiments.

FIG. 2C is a multiple level block diagram, showing contents of a storage node 150 and contents of a non-volatile solid state storage 152 of the storage node 150. Data is communicated to and from the storage node 150 by a network interface controller ('NIC') 202 in some embodiments. Each storage node 150 has a CPU 156, and one or more non-volatile solid state storage 152, as discussed above. Moving down one level in FIG. 2C, each non-volatile solid state storage 152 has a relatively fast non-volatile solid state memory, such as nonvolatile random access memory ('NVRAM') 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 2C, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device ('PLD') 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 161, in various embodiments as disclosed herein, can be contrasted with storage arrays in general. The storage nodes 150 are part of a collection that creates the storage cluster 161. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 161, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 2D:
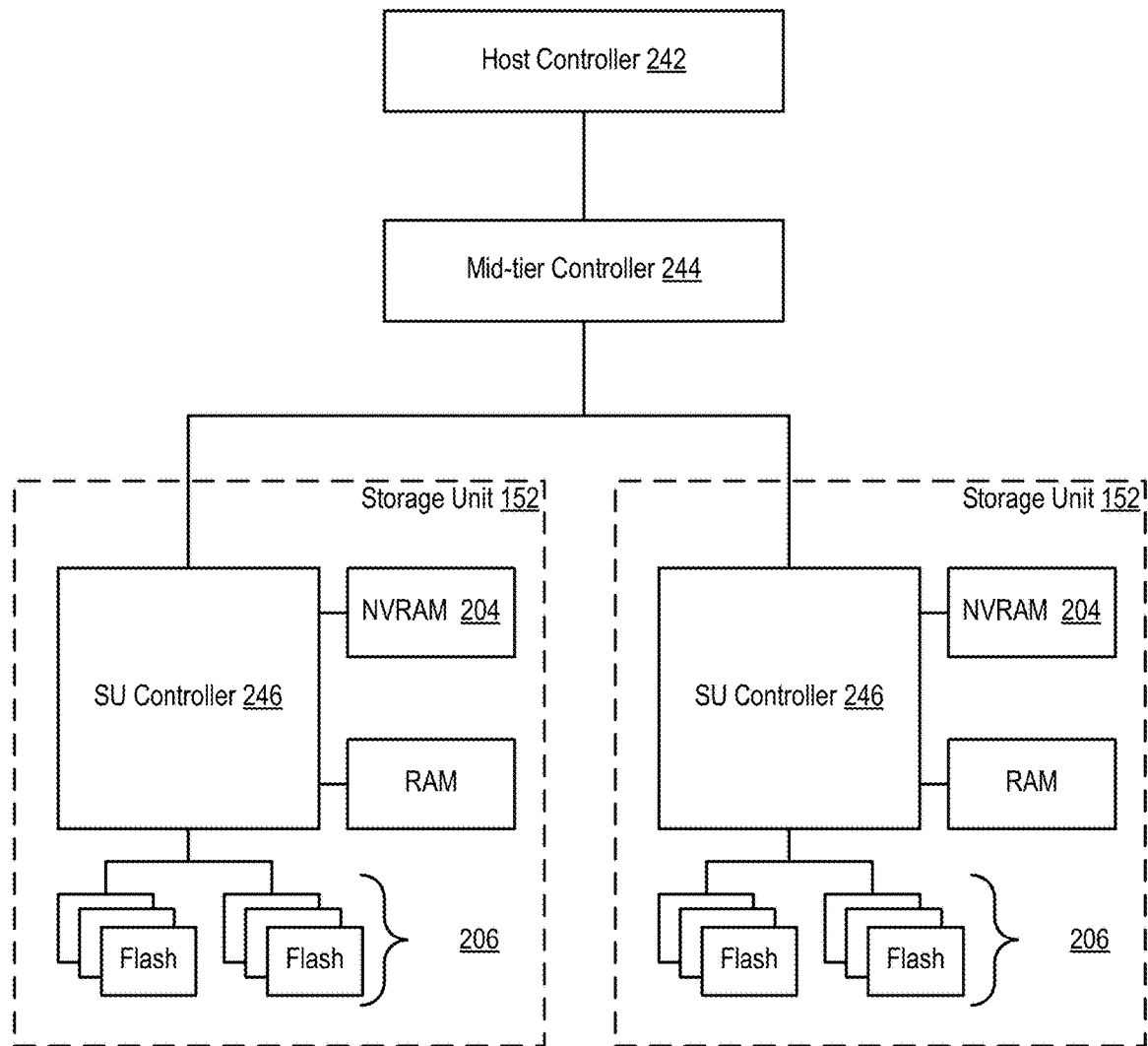
FIG. 2D shows a storage server environment, which uses embodiments of the storage nodes and storage units of some previous figures in accordance with some embodiments.

FIG. 2D shows a storage server environment, which uses embodiments of the storage nodes 150 and storage units 152 of FIGS. 2A-C. In this version, each storage unit 152 has a processor such as controller 212 (see FIG. 2C), an FPGA (field programmable gate array), flash memory 206, and NVRAM 204 (which is super-capacitor backed DRAM 216, see FIGS. 2B and 2C) on a PCIe (peripheral component interconnect express) board in a chassis 138 (see FIG. 2A). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 168 independently. Each device provides an amount of storage space to each authority 168. That authority 168 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 168. This distribution of logical control is shown in FIG. 2D as a host controller 242, mid-tier controller 244 and storage unit controller(s) 246. Management of the control plane and the storage plane are treated independently, although parts may be physically co-located on the same blade. Each authority 168 effectively serves as an independent controller. Each authority 168 provides its own data and metadata structures, its own background workers, and maintains its own lifecycle.

Figure 2E:
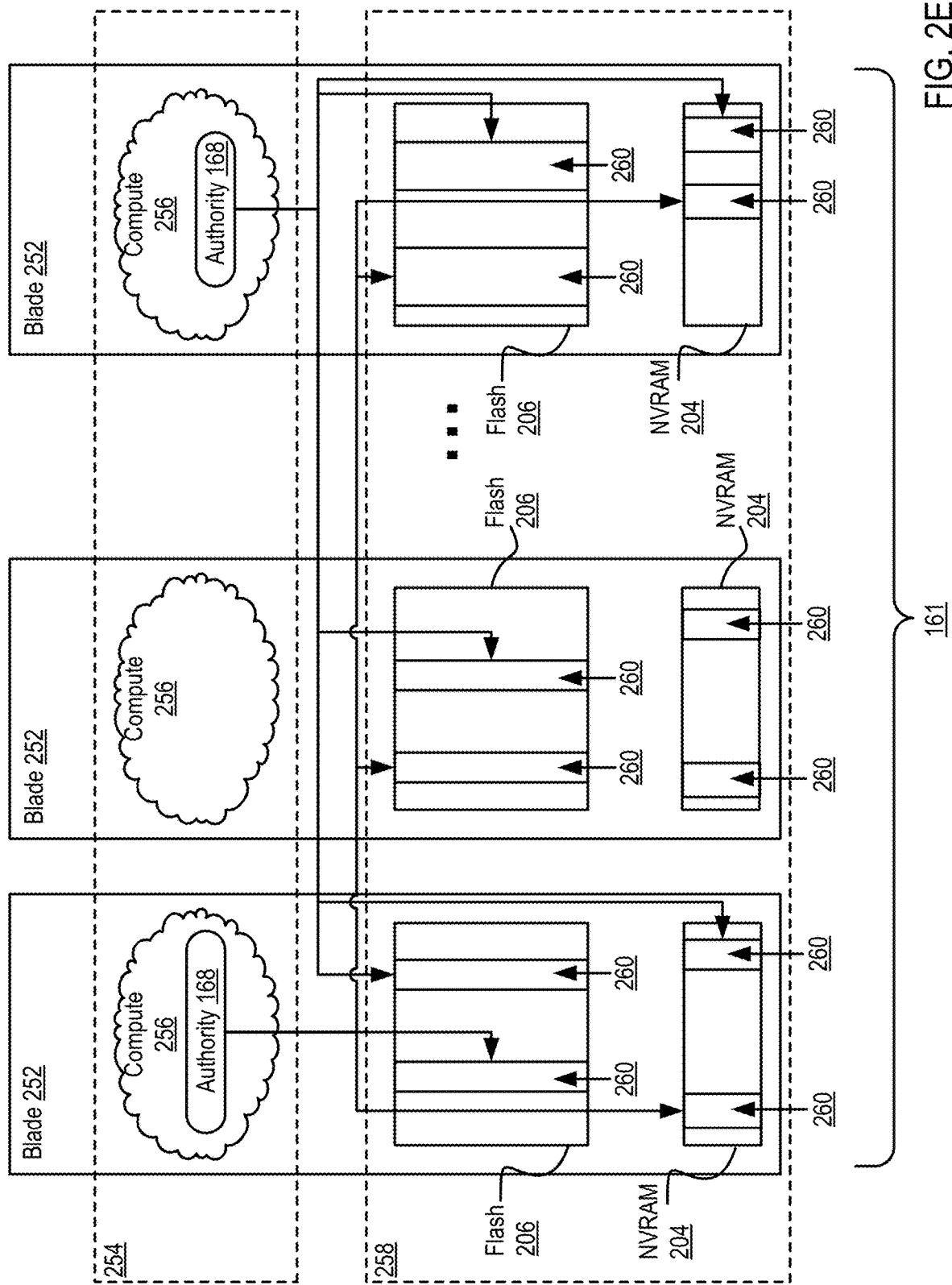
FIG. 2E is a blade hardware block diagram, showing a control plane, compute and storage planes, and authorities interacting with underlying physical resources, in accordance with some embodiments.

FIG. 2E is a blade 252 hardware block diagram, showing a control plane 254, compute and storage planes 256, 258, and authorities 168 interacting with underlying physical resources, using embodiments of the storage nodes 150 and storage units 152 of FIGS. 2A-C in the storage server environment of FIG. 2D. The control plane 254 is partitioned into a number of authorities 168 which can use the compute resources in the compute plane 256 to run on any of the blades 252. The storage plane 258 is partitioned into a set of devices, each of which provides access to flash 206 and NVRAM 204 resources.

In the compute and storage planes 256, 258 of FIG. 2E, the authorities 168 interact with the underlying physical resources (i.e., devices). From the point of view of an authority 168, its resources are striped over all of the physical devices. From the point of view of a device, it provides resources to all authorities 168, irrespective of where the authorities happen to run. Each authority 168 has allocated or has been allocated one or more partitions 260 of storage memory in the storage units 152, e.g. partitions 260 in flash memory 206 and NVRAM 204. Each authority 168 uses those allocated partitions 260 that belong to it, for writing or reading user data. Authorities can be associated with differing amounts of physical storage of the system. For example, one authority 168 could have a larger number of partitions 260 or larger sized partitions 260 in one or more storage units 152 than one or more other authorities 168.

Figure 2F:
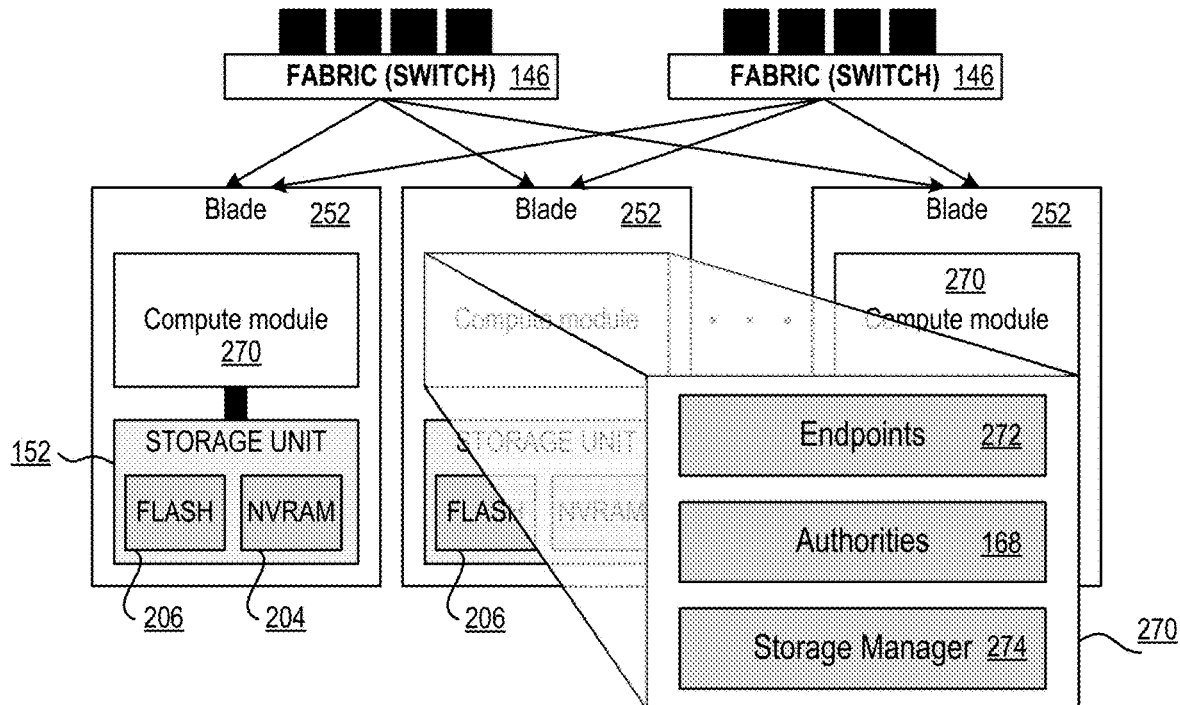
FIG. 2F depicts elasticity software layers in blades of a storage cluster, in accordance with some embodiments.

FIG. 2F depicts elasticity software layers in blades 252 of a storage cluster, in accordance with some embodiments. In the elasticity structure, elasticity software is symmetric, i.e., each blade's compute module 270 runs the three identical layers of processes depicted in FIG. 2F. Storage managers 274 execute read and write requests from other blades 252 for data and metadata stored in local storage unit 152 NVRAM 204 and flash 206. Authorities 168 fulfill client requests by issuing the necessary reads and writes to the blades 252 on whose storage units 152 the corresponding data or metadata resides. Endpoints 272 parse client connection requests received from switch fabric 146 supervisory software, relay the client connection requests to the authorities 168 responsible for fulfillment, and relay the authorities' 168 responses to clients. The symmetric three-layer structure enables the storage system's high degree of concurrency. Elasticity scales out efficiently and reliably in these embodiments. In addition, elasticity implements a unique scale-out technique that balances work evenly across all resources regardless of client access pattern, and maximizes concurrency by eliminating much of the need for inter-blade coordination that typically occurs with conventional distributed locking.

Still referring to FIG. 2F, authorities 168 running in the compute modules 270 of a blade 252 perform the internal operations required to fulfill client requests. One feature of elasticity is that authorities 168 are stateless, i.e., they cache active data and metadata in their own blades' 252 DRAMs for fast access, but the authorities store every update in their NVRAM 204 partitions on three separate blades 252 until the update has been written to flash 206. All the storage system writes to NVRAM 204 are in triplicate to partitions on three separate blades 252 in some embodiments. With triple-mirrored NVRAM 204 and persistent storage protected by parity and Reed-Solomon RAID checksums, the storage system can survive concurrent failure of two blades 252 with no loss of data, metadata, or access to either.

Because authorities 168 are stateless, they can migrate between blades 252. Each authority 168 has a unique identifier. NVRAM 204 and flash 206 partitions are associated with authorities' 168 identifiers, not with the blades 252 on which they are running in some embodiments. Thus, when an authority 168 migrates, the authority 168 continues to manage the same storage partitions from its new location. When a new blade 252 is installed in an embodiment of the storage cluster, the system automatically rebalances load by: partitioning the new blade's 252 storage for use by the system's authorities 168, migrating selected authorities 168 to the new blade 252, starting endpoints 272 on the new blade 252 and including them in the switch fabric's 146 client connection distribution algorithm.

From their new locations, migrated authorities 168 persist the contents of their NVRAM 204 partitions on flash 206, process read and write requests from other authorities 168, and fulfill the client requests that endpoints 272 direct to them. Similarly, if a blade 252 fails or is removed, the system redistributes its authorities 168 among the system's remaining blades 252. The redistributed authorities 168 continue to perform their original functions from their new locations.

Figure 2G:
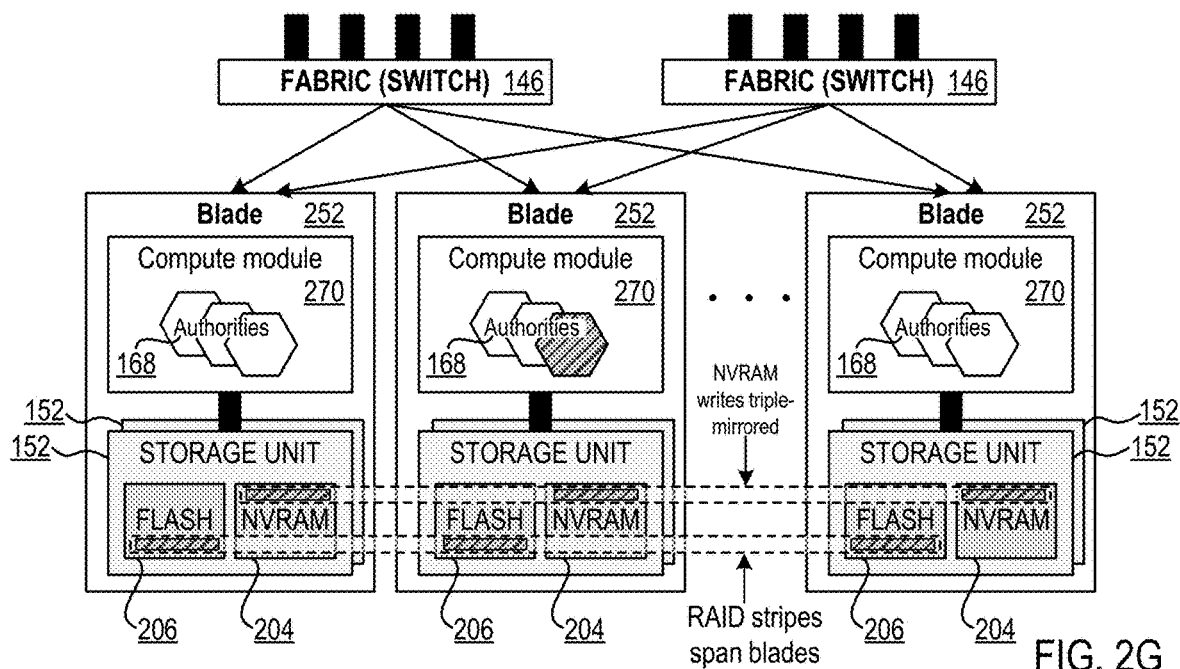
FIG. 2G depicts authorities and storage resources in blades of a storage cluster, in accordance with some embodiments.

FIG. 2G depicts authorities 168 and storage resources in blades 252 of a storage cluster, in accordance with some embodiments. Each authority 168 is exclusively responsible for a partition of the flash 206 and NVRAM 204 on each blade 252. The authority 168 manages the content and integrity of its partitions independently of other authorities 168. Authorities 168 compress incoming data and preserve it temporarily in their NVRAM 204 partitions, and then consolidate, RAID-protect, and persist the data in segments of the storage in their flash 206 partitions. As the authorities 168 write data to flash 206, storage managers 274 perform the necessary flash translation to optimize write performance and maximize media longevity. In the background, authorities 168 "garbage collect," or reclaim space occupied by data that clients have made obsolete by overwriting the data. It should be appreciated that since authorities' 168 partitions are disjoint, there is no need for distributed locking to execute client and writes or to perform background functions.

The embodiments described herein may utilize various software, communication and/or networking protocols. In addition, the configuration of the hardware and/or software may be adjusted to accommodate various protocols. For example, the embodiments may utilize Active Directory, which is a database based system that provides authentication, directory, policy, and other services in a WINDOWS™ environment. In these embodiments, LDAP (Lightweight Directory Access Protocol) is one example application protocol for querying and modifying items in directory service providers such as Active Directory. In some embodiments, a network lock manager ('NLM') is utilized as a facility that works in cooperation with the Network File System ('NFS') to provide a System V style of advisory file and record locking over a network. The Server Message Block ('SMB') protocol, one version of which is also known as Common Internet File System ('CIFS'), may be integrated with the storage systems discussed herein. SMP operates as an application-layer network protocol typically used for providing shared access to files, printers, and serial ports and miscellaneous communications between nodes on a network. SMB also provides an authenticated inter-process communication mechanism. AMAZON™ S3 (Simple Storage Service) is a web service offered by Amazon Web Services, and the systems described herein may interface with Amazon S3 through web services interfaces (REST (representational state transfer), SOAP (simple object access protocol), and BitTorrent). A RESTful API (application programming interface) breaks down a transaction to create a series of small modules. Each module addresses a particular underlying part of the transaction. The control or permissions provided with these embodiments, especially for object data, may include utilization of an access control list ('ACL'). The ACL is a list of permissions attached to an object and the ACL specifies which users or system processes are granted access to objects, as well as what operations are allowed on given objects. The systems may utilize Internet Protocol version 6 ('IPv6'), as well as IPv4, for the communications protocol that provides an identification and location system for computers on networks and routes traffic across the Internet. The routing of packets between networked systems may include Equal-cost multi-path routing ('ECMP'), which is a routing strategy where next-hop packet forwarding to a single destination can occur over multiple "best paths" which tie for top place in routing metric calculations. Multi-path routing can be used in conjunction with most routing protocols, because it is a per-hop decision limited to a single router. The software may support Multi-tenancy, which is an architecture in which a single instance of a software application serves multiple customers. Each customer may be referred to as a tenant. Tenants may be given the ability to customize some parts of the application, but may not customize the application's code, in some embodiments. The embodiments may maintain audit logs. An audit log is a document that records an event in a computing system. In addition to documenting what resources were accessed, audit log entries typically include destination and source addresses, a timestamp, and user login information for compliance with various regulations. The embodiments may support various key management policies, such as encryption key rotation. In addition, the system may support dynamic root passwords or some variation dynamically changing passwords.

Figure 3A:
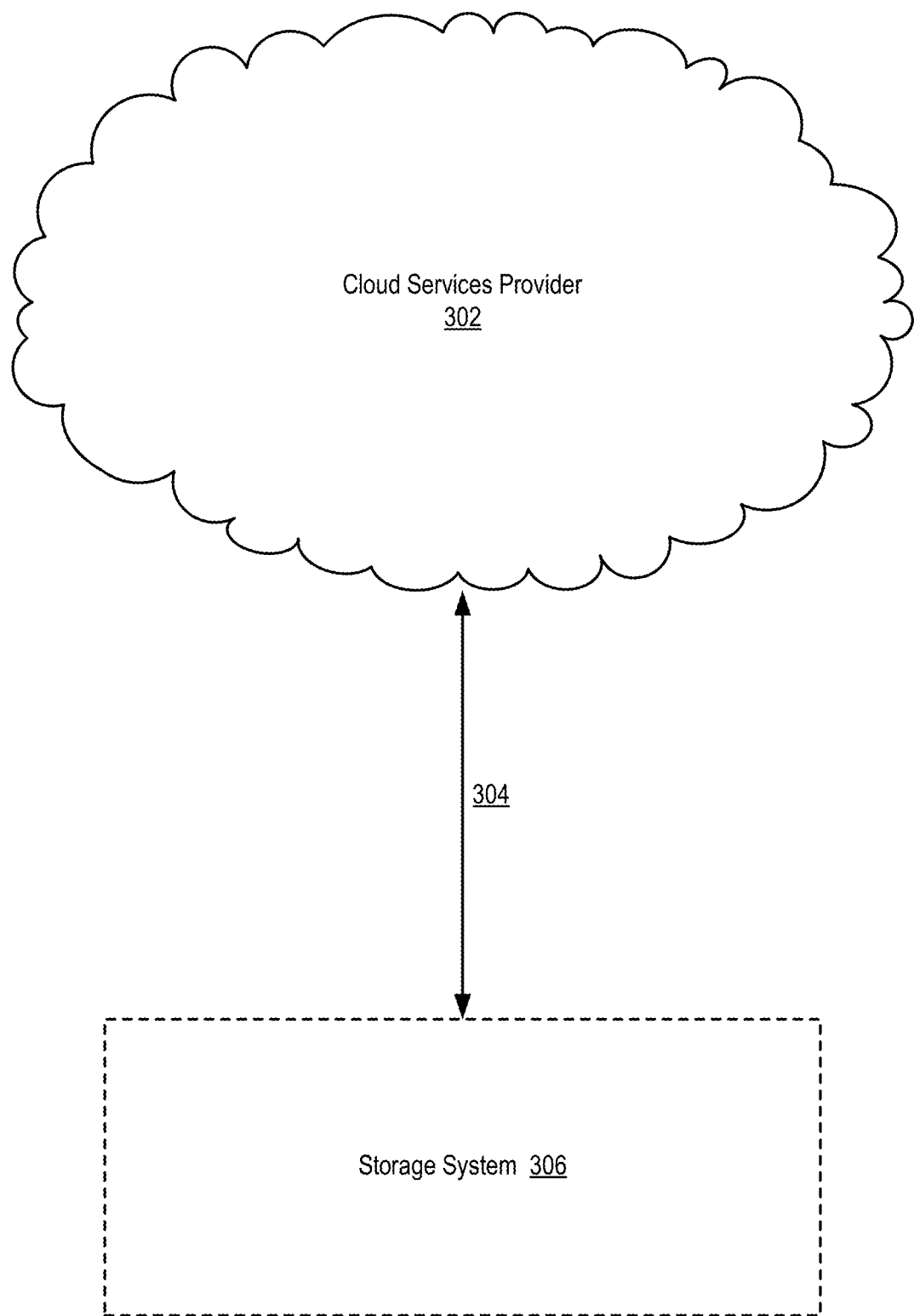
FIG. 3A sets forth a diagram of a storage system that is coupled for data communications with a cloud services provider in accordance with some embodiments of the present disclosure.

FIG. 3A sets forth a diagram of a storage system 306 that is coupled for data communications with a cloud services provider 302 in accordance with some embodiments of the present disclosure. Although depicted in less detail, the storage system 306 depicted in FIG. 3A may be similar to the storage systems described above with reference to FIGS. 1A-1D and FIGS. 2A-2G. In some embodiments, the storage system 306 depicted in FIG. 3A may be embodied as a storage system that includes imbalanced active/active controllers, as a storage system that includes balanced active/active controllers, as a storage system that includes active/active controllers where less than all of each controller's resources are utilized such that each controller has reserve resources that may be used to support failover, as a storage system that includes fully active/active controllers, as a storage system that includes dataset-segregated controllers, as a storage system that includes dual-layer architectures with front-end controllers and back-end integrated storage controllers, as a storage system that includes scale-out clusters of dual-controller arrays, as well as combinations of such embodiments.

In the example depicted in FIG. 3A, the storage system 306 is coupled to the cloud services provider 302 via a data communications link 304. The data communications link 304 may be embodied as a dedicated data communications link, as a data communications pathway that is provided through the use of one or data communications networks such as a wide area network ('WAN') or local area network ('LAN'), or as some other mechanism capable of transporting digital information between the storage system 306 and the cloud services provider 302. Such a data communications link 304 may be fully wired, fully wireless, or some aggregation of wired and wireless data communications pathways. In such an example, digital information may be exchanged between the storage system 306 and the cloud services provider 302 via the data communications link 304 using one or more data communications protocols. For example, digital information may be exchanged between the storage system 306 and the cloud services provider 302 via the data communications link 304 using the handheld device transfer protocol ('HDTP'), hypertext transfer protocol ('HTTP'), internet protocol ('IP'), real-time transfer protocol ('RTP'), transmission control protocol ('TCP'), user datagram protocol ('UDP'), wireless application protocol ('WAP'), or other protocol.

The cloud services provider 302 depicted in FIG. 3A may be embodied, for example, as a system and computing environment that provides services to users of the cloud services provider 302 through the sharing of computing resources via the data communications link 304. The cloud services provider 302 may provide on-demand access to a shared pool of configurable computing resources such as computer networks, servers, storage, applications and services, and so on. The shared pool of configurable resources may be rapidly provisioned and released to a user of the cloud services provider 302 with minimal management effort. Generally, the user of the cloud services provider 302 is unaware of the exact computing resources utilized by the cloud services provider 302 to provide the services. Although in many cases such a cloud services provider 302 may be accessible via the Internet, readers of skill in the art will recognize that any system that abstracts the use of shared resources to provide services to a user through any data communications link may be considered a cloud services provider 302.

In the example depicted in FIG. 3A, the cloud services provider 302 may be configured to provide a variety of services to the storage system 306 and users of the storage system 306 through the implementation of various service models. For example, the cloud services provider 302 may be configured to provide services to the storage system 306 and users of the storage system 306 through the implementation of an infrastructure as a service ('IaaS') service model where the cloud services provider 302 offers computing infrastructure such as virtual machines and other resources as a service to subscribers. In addition, the cloud services provider 302 may be configured to provide services to the storage system 306 and users of the storage system 306 through the implementation of a platform as a service ('PaaS') service model where the cloud services provider 302 offers a development environment to application developers. Such a development environment may include, for example, an operating system, programming-language execution environment, database, web server, or other components that may be utilized by application developers to develop and run software solutions on a cloud platform. Furthermore, the cloud services provider 302 may be configured to provide services to the storage system 306 and users of the storage system 306 through the implementation of a software as a service ('SaaS') service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. The cloud services provider 302 may be further configured to provide services to the storage system 306 and users of the storage system 306 through the implementation of an authentication as a service ('AaaS') service model where the cloud services provider 302 offers authentication services that can be used to secure access to applications, data sources, or other resources. The cloud services provider 302 may also be configured to provide services to the storage system 306 and users of the storage system 306 through the implementation of a storage as a service model where the cloud services provider 302 offers access to its storage infrastructure for use by the storage system 306 and users of the storage system 306. Readers will appreciate that the cloud services provider 302 may be configured to provide additional services to the storage system 306 and users of the storage system 306 through the implementation of additional service models, as the service models described above are included only for explanatory purposes and in no way represent a limitation of the services that may be offered by the cloud services provider 302 or a limitation as to the service models that may be implemented by the cloud services provider 302.

In the example depicted in FIG. 3A, the cloud services provider 302 may be embodied, for example, as a private cloud, as a public cloud, or as a combination of a private cloud and public cloud. In an embodiment in which the cloud services provider 302 is embodied as a private cloud, the cloud services provider 302 may be dedicated to providing services to a single organization rather than providing services to multiple organizations. In an embodiment where the cloud services provider 302 is embodied as a public cloud, the cloud services provider 302 may provide services to multiple organizations. Public cloud and private cloud deployment models may differ and may come with various advantages and disadvantages. For example, because a public cloud deployment involves the sharing of a computing infrastructure across different organization, such a deployment may not be ideal for organizations with security concerns, mission-critical workloads, uptime requirements demands, and so on. While a private cloud deployment can address some of these issues, a private cloud deployment may require on-premises staff to manage the private cloud. In still alternative embodiments, the cloud services provider 302 may be embodied as a mix of a private and public cloud services with a hybrid cloud deployment.

Although not explicitly depicted in FIG. 3A, readers will appreciate that additional hardware components and additional software components may be necessary to facilitate the delivery of cloud services to the storage system 306 and users of the storage system 306. For example, the storage system 306 may be coupled to (or even include) a cloud storage gateway. Such a cloud storage gateway may be embodied, for example, as hardware-based or software-based appliance that is located on premises with the storage system 306. Such a cloud storage gateway may operate as a bridge between local applications that are executing on the storage array 306 and remote, cloud-based storage that is utilized by the storage array 306. Through the use of a cloud storage gateway, organizations may move primary iSCSI or NAS to the cloud services provider 302, thereby enabling the organization to save space on their on-premises storage systems. Such a cloud storage gateway may be configured to emulate a disk array, a block-based device, a file server, or other storage system that can translate the SCSI commands, file server commands, or other appropriate command into REST-space protocols that facilitate communications with the cloud services provider 302.

In order to enable the storage system 306 and users of the storage system 306 to make use of the services provided by the cloud services provider 302, a cloud migration process may take place during which data, applications, or other elements from an organization's local systems (or even from another cloud environment) are moved to the cloud services provider 302. In order to successfully migrate data, applications, or other elements to the cloud services provider's 302 environment, middleware such as a cloud migration tool may be utilized to bridge gaps between the cloud services provider's 302 environment and an organization's environment. Such cloud migration tools may also be configured to address potentially high network costs and long transfer times associated with migrating large volumes of data to the cloud services provider 302, as well as addressing security concerns associated with sensitive data to the cloud services provider 302 over data communications networks. In order to further enable the storage system 306 and users of the storage system 306 to make use of the services provided by the cloud services provider 302, a cloud orchestrator may also be used to arrange and coordinate automated tasks in pursuit of creating a consolidated process or workflow. Such a cloud orchestrator may perform tasks such as configuring various components, whether those components are cloud components or on-premises components, as well as managing the interconnections between such components. The cloud orchestrator can simplify the inter-component communication and connections to ensure that links are correctly configured and maintained.

In the example depicted in FIG. 3A, and as described briefly above, the cloud services provider 302 may be configured to provide services to the storage system 306 and users of the storage system 306 through the usage of a SaaS service model where the cloud services provider 302 offers application software, databases, as well as the platforms that are used to run the applications to the storage system 306 and users of the storage system 306, providing the storage system 306 and users of the storage system 306 with on-demand software and eliminating the need to install and run the application on local computers, which may simplify maintenance and support of the application. Such applications may take many forms in accordance with various embodiments of the present disclosure. For example, the cloud services provider 302 may be configured to provide access to data analytics applications to the storage system 306 and users of the storage system 306. Such data analytics applications may be configured, for example, to receive telemetry data phoned home by the storage system 306. Such telemetry data may describe various operating characteristics of the storage system 306 and may be analyzed, for example, to determine the health of the storage system 306, to identify workloads that are executing on the storage system 306, to predict when the storage system 306 will run out of various resources, to recommend configuration changes, hardware or software upgrades, workflow migrations, or other actions that may improve the operation of the storage system 306.

The cloud services provider 302 may also be configured to provide access to virtualized computing environments to the storage system 306 and users of the storage system 306. Such virtualized computing environments may be embodied, for example, as a virtual machine or other virtualized computer hardware platforms, virtual storage devices, virtualized computer network resources, and so on. Examples of such virtualized environments can include virtual machines that are created to emulate an actual computer, virtualized desktop environments that separate a logical desktop from a physical machine, virtualized file systems that allow uniform access to different types of concrete file systems, and many others.

Figure 3B:
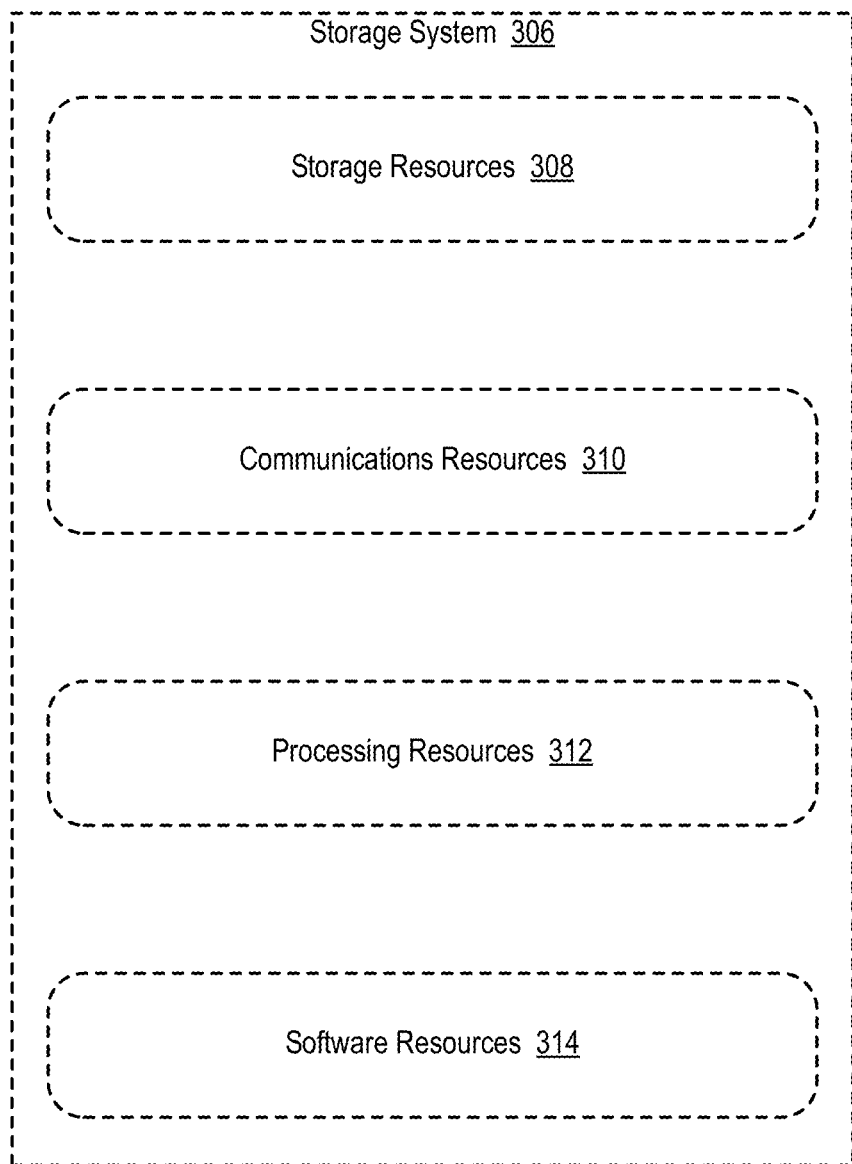
FIG. 3B sets forth a diagram of a storage system in accordance with some embodiments of the present disclosure.

For further explanation, FIG. 3B sets forth a diagram of a storage system 306 in accordance with some embodiments of the present disclosure. Although depicted in less detail, the storage system 306 depicted in FIG. 3B may be similar to the storage systems described above with reference to FIGS. 1A-1D and FIGS. 2A-2G as the storage system may include many of the components described above.

The storage system 306 depicted in FIG. 3B may include storage resources 308, which may be embodied in many forms. For example, in some embodiments the storage resources 308 can include nano-RAM or another form of nonvolatile random access memory that utilizes carbon nanotubes deposited on a substrate. In some embodiments, the storage resources 308 may include 3D crosspoint non-volatile memory in which bit storage is based on a change of bulk resistance, in conjunction with a stackable cross-gridded data access array. In some embodiments, the storage resources 308 may include flash memory, including single-level cell ('SLC') NAND flash, multi-level cell ('MLC') NAND flash, triple-level cell ('TLC') NAND flash, quad-level cell ('QLC') NAND flash, and others. In some embodiments, the storage resources 308 may include non-volatile magnetoresistive random-access memory ('MRAM'), including spin transfer torque ('STT') MRAM, in which data is stored through the use of magnetic storage elements. In some embodiments, the example storage resources 308 may include non-volatile phase-change memory ('PCM') that may have the ability to hold multiple bits in a single cell as cells can achieve a number of distinct intermediary states. In some embodiments, the storage resources 308 may include quantum memory that allows for the storage and retrieval of photonic quantum information. In some embodiments, the example storage resources 308 may include resistive random-access memory ('ReRAM') in which data is stored by changing the resistance across a dielectric solid-state material. In some embodiments, the storage resources 308 may include storage class memory ('SCM') in which solid-state nonvolatile memory may be manufactured at a high density using some combination of sub-lithographic patterning techniques, multiple bits per cell, multiple layers of devices, and so on. Readers will appreciate that other forms of computer memories and storage devices may be utilized by the storage systems described above, including DRAM, SRAM, EEPROM, universal memory, and many others. The storage resources 308 depicted in FIG. 3A may be embodied in a variety of form factors, including but not limited to, dual in-line memory modules ('DIMMs'), non-volatile dual in-line memory modules ('NVDIMMs'), M.2, U.2, and others.

The example storage system 306 depicted in FIG. 3B may implement a variety of storage architectures. For example, storage systems in accordance with some embodiments of the present disclosure may utilize block storage where data is stored in blocks, and each block essentially acts as an individual hard drive. Storage systems in accordance with some embodiments of the present disclosure may utilize object storage, where data is managed as objects. Each object may include the data itself, a variable amount of metadata, and a globally unique identifier, where object storage can be implemented at multiple levels (e.g., device level, system level, interface level). Storage systems in accordance with some embodiments of the present disclosure utilize file storage in which data is stored in a hierarchical structure. Such data may be saved in files and folders, and presented to both the system storing it and the system retrieving it in the same format.

The example storage system 306 depicted in FIG. 3B may be embodied as a storage system in which additional storage resources can be added through the use of a scale-up model, additional storage resources can be added through the use of a scale-out model, or through some combination thereof. In a scale-up model, additional storage may be added by adding additional storage devices. In a scale-out model, however, additional storage nodes may be added to a cluster of storage nodes, where such storage nodes can include additional processing resources, additional networking resources, and so on.

The storage system 306 depicted in FIG. 3B also includes communications resources 310 that may be useful in facilitating data communications between components within the storage system 306, as well as data communications between the storage system 306 and computing devices that are outside of the storage system 306. The communications resources 310 may be configured to utilize a variety of different protocols and data communication fabrics to facilitate data communications between components within the storage systems as well as computing devices that are outside of the storage system. For example, the communications resources 310 can include fibre channel ('FC') technologies such as FC fabrics and FC protocols that can transport SCSI commands over FC networks. The communications resources 310 can also include FC over ethernet ('FCoE') technologies through which FC frames are encapsulated and transmitted over Ethernet networks. The communications resources 310 can also include InfiniBand ('IB') technologies in which a switched fabric topology is utilized to facilitate transmissions between channel adapters. The communications resources 310 can also include NVM Express ('NVMe') technologies and NVMe over fabrics ('NVMeoF') technologies through which non-volatile storage media attached via a PCI express ('PCIe') bus may be accessed. The communications resources 310 can also include mechanisms for accessing storage resources 308 within the storage system 306 utilizing serial attached SCSI ('SAS'), serial ATA ('SATA') bus interfaces for connecting storage resources 308 within the storage system 306 to host bus adapters within the storage system 306, internet small computer systems interface ('iSCSI') technologies to provide block-level access to storage resources 308 within the storage system 306, and other communications resources that may be useful in facilitating data communications between components within the storage system 306, as well as data communications between the storage system 306 and computing devices that are outside of the storage system 306.

The storage system 306 depicted in FIG. 3B also includes processing resources 312 that may be useful in executing computer program instructions and performing other computational tasks within the storage system 306. The processing resources 312 may include one or more application-specific integrated circuits ('ASICs') that are customized for some particular purpose as well as one or more central processing units ('CPUs'). The processing resources 312 may also include one or more digital signal processors ('DSPs'), one or more field-programmable gate arrays ('FPGAs'), one or more systems on a chip ('SoCs'), or other form of processing resources 312. The storage system 306 may utilize the storage resources 312 to perform a variety of tasks including, but not limited to, supporting the execution of software resources 314 that will be described in greater detail below.

The storage system 306 depicted in FIG. 3B also includes software resources 314 that, when executed by processing resources 312 within the storage system 306, may perform various tasks. The software resources 314 may include, for example, one or more modules of computer program instructions that when executed by processing resources 312 within the storage system 306 are useful in carrying out various data protection techniques to preserve the integrity of data that is stored within the storage systems. Readers will appreciate that such data protection techniques may be carried out, for example, by system software executing on computer hardware within the storage system, by a cloud services provider, or in other ways. Such data protection techniques can include, for example, data archiving techniques that cause data that is no longer actively used to be moved to a separate storage device or separate storage system for long-term retention, data backup techniques through which data stored in the storage system may be copied and stored in a distinct location to avoid data loss in the event of equipment failure or some other form of catastrophe with the storage system, data replication techniques through which data stored in the storage system is replicated to another storage system such that the data may be accessible via multiple storage systems, data snapshotting techniques through which the state of data within the storage system is captured at various points in time, data and database cloning techniques through which duplicate copies of data and databases may be created, and other data protection techniques. Through the use of such data protection techniques, business continuity and disaster recovery objectives may be met as a failure of the storage system may not result in the loss of data stored in the storage system.

The software resources 314 may also include software that is useful in implementing software-defined storage ('SDS'). In such an example, the software resources 314 may include one or more modules of computer program instructions that, when executed, are useful in policy-based provisioning and management of data storage that is independent of the underlying hardware. Such software resources 314 may be useful in implementing storage virtualization to separate the storage hardware from the software that manages the storage hardware.

The software resources 314 may also include software that is useful in facilitating and optimizing I/O operations that are directed to the storage resources 308 in the storage system 306. For example, the software resources 314 may include software modules that perform carry out various data reduction techniques such as, for example, data compression, data deduplication, and others. The software resources 314 may include software modules that intelligently group together I/O operations to facilitate better usage of the underlying storage resource 308, software modules that perform data migration operations to migrate from within a storage system, as well as software modules that perform other functions. Such software resources 314 may be embodied as one or more software containers or in many other ways.

Readers will appreciate that the various components depicted in FIG. 3B may be grouped into one or more optimized computing packages as converged infrastructures.

Such converged infrastructures may include pools of computers, storage and networking resources that can be shared by multiple applications and managed in a collective manner using policy-driven processes. Such converged infrastructures may minimize compatibility issues between various components within the storage system 306 while also reducing various costs associated with the establishment and operation of the storage system 306. Such converged infrastructures may be implemented with a converged infrastructure reference architecture, with standalone appliances, with a software driven hyper-converged approach (e.g., hyper-converged infrastructures), or in other ways.

Readers will appreciate that the storage system 306 depicted in FIG. 3B may be useful for supporting various types of software applications. For example, the storage system 306 may be useful in supporting artificial intelligence ('AI') applications, database applications, DevOps projects, electronic design automation tools, event-driven software applications, high performance computing applications, simulation applications, high-speed data capture and analysis applications, machine learning applications, media production applications, media serving applications, picture archiving and communication systems ('PACS') applications, software development applications, virtual reality applications, augmented reality applications, and many other types of applications by providing storage resources to such applications.

The storage systems described above may operate to support a wide variety of applications. In view of the fact that the storage systems include compute resources, storage resources, and a wide variety of other resources, the storage systems may be well suited to support applications that are resource intensive such as, for example, AI applications. Such AI applications may enable devices to perceive their environment and take actions that maximize their chance of success at some goal. Examples of such AI applications can include IBM Watson, Microsoft Oxford, Google DeepMind, Baidu Minwa, and others. The storage systems described above may also be well suited to support other types of applications that are resource intensive such as, for example, machine learning applications. Machine learning applications may perform various types of data analysis to automate analytical model building. Using algorithms that iteratively learn from data, machine learning applications can enable computers to learn without being explicitly programmed.

In addition to the resources already described, the storage systems described above may also include graphics processing units ('GPUs'), occasionally referred to as visual processing unit ('VPUs'). Such GPUs may be embodied as specialized electronic circuits that rapidly manipulate and alter memory to accelerate the creation of images in a frame buffer intended for output to a display device. Such GPUs may be included within any of the computing devices that are part of the storage systems described above, including as one of many individually scalable components of a storage system, where other examples of individually scalable components of such storage system can include storage components, memory components, compute components (e.g., CPUs, FPGAs, ASICs), networking components, software components, and others. In addition to GPUs, the storage systems described above may also include neural network processors ('NNPs') for use in various aspects of neural network processing. Such NNPs may be used in place of (or in addition to) GPUs and may be also be independently scalable.

As described above, the storage systems described herein may be configured to support artificial intelligence applications, machine learning applications, big data analytics applications, and many other types of applications. The rapid growth in these sort of applications is being driven by three technologies: deep learning (DL), GPU processors, and Big Data. Deep learning is a computing model that makes use of massively parallel neural networks inspired by the human brain. Instead of experts handcrafting software, a deep learning model writes its own software by learning from lots of examples. A GPU is a modern processor with thousands of cores, well-suited to run algorithms that loosely represent the parallel nature of the human brain.

Advances in deep neural networks have ignited a new wave of algorithms and tools for data scientists to tap into their data with artificial intelligence (AI). With improved algorithms, larger data sets, and various frameworks (including open-source software libraries for machine learning across a range of tasks), data scientists are tackling new use cases like autonomous driving vehicles, natural language processing and understanding, computer vision, machine reasoning, strong AI, and many others. Applications of such techniques may include: machine and vehicular object detection, identification and avoidance; visual recognition, classification and tagging; algorithmic financial trading strategy performance management; simultaneous localization and mapping; predictive maintenance of high-value machinery; prevention against cyber security threats, expertise automation; image recognition and classification; question answering; robotics; text analytics (extraction, classification) and text generation and translation; and many others. Applications of AI techniques has materialized in a wide array of products include, for example, Amazon Echo's speech recognition technology that allows users to talk to their machines, Google Translate™ which allows for machine-based language translation, Spotify's Discover Weekly that provides recommendations on new songs and artists that a user may like based on the user's usage and traffic analysis, Quill's text generation offering that takes structured data and turns it into narrative stories, Chatbots that provide real-time, contextually specific answers to questions in a dialog format, and many others. Furthermore, AI may impact a wide variety of industries and sectors. For example, AI solutions may be used in healthcare to take clinical notes, patient files, research data, and other inputs to generate potential treatment options for doctors to explore. Likewise, AI solutions may be used by retailers to personalize consumer recommendations based on a person's digital footprint of behaviors, profile data, or other data.

Training deep neural networks, however, requires both high quality input data and large amounts of computation. GPUs are massively parallel processors capable of operating on large amounts of data simultaneously. When combined into a multi-GPU cluster, a high throughput pipeline may be required to feed input data from storage to the compute engines. Deep learning is more than just constructing and training models. There also exists an entire data pipeline that must be designed for the scale, iteration, and experimentation necessary for a data science team to succeed.

Data is the heart of modern AI and deep learning algorithms. Before training can begin, one problem that must be addressed revolves around collecting the labeled data that is crucial for training an accurate AI model. A full scale AI deployment may be required to continuously collect, clean, transform, label, and store large amounts of data. Adding additional high quality data points directly translates to more accurate models and better insights. Data samples may undergo a series of processing steps including, but not limited to: 1) ingesting the data from an external source into the training system and storing the data in raw form, 2) cleaning and transforming the data in a format convenient for training, including linking data samples to the appropriate label, 3) exploring parameters and models, quickly testing with a smaller dataset, and iterating to converge on the most promising models to push into the production cluster, 4) executing training phases to select random batches of input data, including both new and older samples, and feeding those into production GPU servers for computation to update model parameters, and 5) evaluating including using a holdback portion of the data not used in training in order to evaluate model accuracy on the holdout data. This lifecycle may apply for any type of parallelized machine learning, not just neural networks or deep learning. For example, standard machine learning frameworks may rely on CPUs instead of GPUs but the data ingest and training workflows may be the same. Readers will appreciate that a single shared storage data hub creates a coordination point throughout the lifecycle without the need for extra data copies among the ingest, preprocessing, and training stages. Rarely is the ingested data used for only one purpose, and shared storage gives the flexibility to train multiple different models or apply traditional analytics to the data.

Readers will appreciate that each stage in the AI data pipeline may have varying requirements from the data hub (e.g., the storage system or collection of storage systems). Scale-out storage systems must deliver uncompromising performance for all manner of access types and patterns—from small, metadata-heavy to large files, from random to sequential access patterns, and from low to high concurrency. The storage systems described above may serve as an ideal AI data hub as the systems may service unstructured workloads. In the first stage, data is ideally ingested and stored on to the same data hub that following stages will use, in order to avoid excess data copying. The next two steps can be done on a standard compute server that optionally includes a GPU, and then in the fourth and last stage, full training production jobs are run on powerful GPU-accelerated servers. Often, there is a production pipeline alongside an experimental pipeline operating on the same dataset. Further, the GPU-accelerated servers can be used independently for different models or joined together to train on one larger model, even spanning multiple systems for distributed training. If the shared storage tier is slow, then data must be copied to local storage for each phase, resulting in wasted time staging data onto different servers. The ideal data hub for the AI training pipeline delivers performance similar to data stored locally on the server node while also having the simplicity and performance to enable all pipeline stages to operate concurrently.

A data scientist works to improve the usefulness of the trained model through a wide variety of approaches: more data, better data, smarter training, and deeper models. In many cases, there will be teams of data scientists sharing the same datasets and working in parallel to produce new and improved training models. Often, there is a team of data scientists working within these phases concurrently on the same shared datasets. Multiple, concurrent workloads of data processing, experimentation, and full-scale training layer the demands of multiple access patterns on the storage tier. In other words, storage cannot just satisfy large file reads, but must contend with a mix of large and small file reads and writes. Finally, with multiple data scientists exploring datasets and models, it may be critical to store data in its native format to provide flexibility for each user to transform, clean, and use the data in a unique way. The storage systems described above may provide a natural shared storage home for the dataset, with data protection redundancy (e.g., by using RAID6) and the performance necessary to be a common access point for multiple developers and multiple experiments. Using the storage systems described above may avoid the need to carefully copy subsets of the data for local work, saving both engineering and GPU-accelerated servers use time. These copies become a constant and growing tax as the raw data set and desired transformations constantly update and change.

Readers will appreciate that a fundamental reason why deep learning has seen a surge in success is the continued improvement of models with larger data set sizes. In contrast, classical machine learning algorithms, like logistic regression, stop improving in accuracy at smaller data set sizes. As such, the separation of compute resources and storage resources may also allow independent scaling of each tier, avoiding many of the complexities inherent in managing both together. As the data set size grows or new data sets are considered, a scale out storage system must be able to expand easily. Similarly, if more concurrent training is required, additional GPUs or other compute resources can be added without concern for their internal storage. Furthermore, the storage systems described above may make building, operating, and growing an AI system easier due to the random read bandwidth provided by the storage systems, the ability to of the storage systems to randomly read small files (50 KB) high rates (meaning that no extra effort is required to aggregate individual data points to make larger, storage-friendly files), the ability of the storage systems to scale capacity and performance as either the dataset grows or the throughput requirements grow, the ability of the storage systems to support files or objects, the ability of the storage systems to tune performance for large or small files (i.e., no need for the user to provision filesystems), the ability of the storage systems to support non-disruptive upgrades of hardware and software even during production model training, and for many other reasons.

Small file performance of the storage tier may be critical as many types of inputs, including text, audio, or images will be natively stored as small files. If the storage tier does not handle small files well, an extra step will be required to pre-process and group samples into larger files. Storage, built on top of spinning disks, that relies on SSD as a caching tier, may fall short of the performance needed. Because training with random input batches results in more accurate models, the entire data set must be accessible with full performance. SSD caches only provide high performance for a small subset of the data and will be ineffective at hiding the latency of spinning drives.

Although the preceding paragraphs discuss deep learning applications, readers will appreciate that the storage systems described herein may also be part of a distributed deep learning ('DDL') platform to support the execution of DDL algorithms. Distributed deep learning may can be used to significantly accelerate deep learning with distributed computing on GPUs (or other form of accelerator or computer program instruction executor), such that parallelism can be achieved. In addition, the output of training machine learning and deep learning models, such as a fully trained machine learning model, may be used for a variety of purposes and in conjunction with other tools. For example, trained machine learning models may be used in conjunction with tools like Core ML to integrate a broad variety of machine learning model types into an application. In fact, trained models may be run through Core ML converter tools and inserted into a custom application that can be deployed on compatible devices. The storage systems described above may also be paired with other technologies such as TensorFlow, an open-source software library for dataflow programming across a range of tasks that may be used for machine learning applications such as neural networks, to facilitate the development of such machine learning models, applications, and so on.

The storage systems described above may also be used in a neuromorphic computing environment. Neuromorphic computing is a form of computing that mimics brain cells. To support neuromorphic computing, an architecture of interconnected "neurons" replace traditional computing models with low-powered signals that go directly between neurons for more efficient computation. Neuromorphic computing may make use of very-large-scale integration (VLSI) systems containing electronic analog circuits to mimic neuro-biological architectures present in the nervous system, as well as analog, digital, mixed-mode analog/digital VLSI, and software systems that implement models of neural systems for perception, motor control, or multisensory integration.

Readers will appreciate that the storage systems described above may be configured to support the storage or use of (among of types of data) blockchains. Such blockchains may be embodied as a continuously growing list of records, called blocks, which are linked and secured using cryptography. Each block in a blockchain may contain a hash pointer as a link to a previous block, a timestamp, transaction data, and so on. Blockchains may be designed to be resistant to modification of the data and can serve as an open, distributed ledger that can record transactions between two parties efficiently and in a verifiable and permanent way. This makes blockchains potentially suitable for the recording of events, medical records, and other records management activities, such as identity management, transaction processing, and others. In addition to supporting the storage and use of blockchain technologies, the storage systems described above may also support the storage and use of derivative items such as, for example, open source blockchains and related tools that are part of the IBM™ Hyperledger project, permissioned blockchains in which a certain number of trusted parties are allowed to access the block chain, blockchain products that enable developers to build their own distributed ledger projects, and others. Readers will appreciate that blockchain technologies may impact a wide variety of industries and sectors. For example, blockchain technologies may be used in real estate transactions as blockchain based contracts whose use can eliminate the need for $3^{rd}$ parties and enable self-executing actions when conditions are met. Likewise, universal health records can be created by aggregating and placing a person's health history onto a blockchain ledger for any healthcare provider, or permissioned health care providers, to access and update.

Readers will further appreciate that in some embodiments, the storage systems described above may be paired with other resources to support the applications described above. For example, one infrastructure could include primary compute in the form of servers and workstations which specialize in using General-purpose computing on graphics processing units ('GPGPU') to accelerate deep learning applications that are interconnected into a computation engine to train parameters for deep neural networks. Each system may have Ethernet external connectivity, InfiniBand external connectivity, some other form of external connectivity, or some combination thereof. In such an example, the GPUs can be grouped for a single large training or used independently to train multiple models. The infrastructure could also include a storage system such as those described above to provide, for example, a scale-out all-flash file or object store through which data can be accessed via high-performance protocols such as NFS, S3, and so on. The infrastructure can also include, for example, redundant top-of-rack Ethernet switches connected to storage and compute via ports in MLAG port channels for redundancy. The infrastructure could also include additional compute in the form of whitebox servers, optionally with GPUs, for data ingestion, pre-processing, and model debugging. Readers will appreciate that additional infrastructures are also possible.

Readers will appreciate that the systems described above may be better suited for the applications described above relative to other systems that may include, for example, a distributed direct-attached storage (DDAS) solution deployed in server nodes. Such DDAS solutions may be built for handling large, less sequential accesses but may be less able to handle small, random accesses. Readers will further appreciate that the storage systems described above may be utilized to provide a platform for the applications described above that is preferable to the utilization of cloud-based resources as the storage systems may be included in an on-site or in-house infrastructure that is more secure, more locally and internally managed, more robust in feature sets and performance, or otherwise preferable to the utilization of cloud-based resources as part of a platform to support the applications described above. For example, services built on platforms such as IBM's Watson may require a business enterprise to distribute individual user information, such as financial transaction information or identifiable patient records, to other institutions. As such, cloud-based offerings of AI as a service may be less desirable than internally managed and offered AI as a service that is supported by storage systems such as the storage systems described above, for a wide array of technical reasons as well as for various business reasons.

Readers will appreciate that the storage systems described above, either alone or in coordination with other computing machinery may be configured to support other AI related tools. For example, the storage systems may make use of tools like ONXX or other open neural network exchange formats that make it easier to transfer models written in different AI frameworks. Likewise, the storage systems may be configured to support tools like Amazon's Gluon that allow developers to prototype, build, and train deep learning models. In fact, the storage systems described above may be part of a larger platform, such as IBM™ Cloud Private for Data, that includes integrated data science, data engineering and application building services. Such platforms may seamlessly collect, organize, secure, and analyze data across an enterprise, as well as simplify hybrid data management, unified data governance and integration, data science and business analytics with a single solution.

Readers will further appreciate that the storage systems described above may also be deployed as an edge solution. Such an edge solution may be in place to optimize cloud computing systems by performing data processing at the edge of the network, near the source of the data. Edge computing can push applications, data and computing power (i.e., services) away from centralized points to the logical extremes of a network. Through the use of edge solutions such as the storage systems described above, computational tasks may be performed using the compute resources provided by such storage systems, data may be storage using the storage resources of the storage system, and cloud-based services may be accessed through the use of various resources of the storage system (including networking resources). By performing computational tasks on the edge solution, storing data on the edge solution, and generally making use of the edge solution, the consumption of expensive cloud-based resources may be avoided and, in fact, performance improvements may be experienced relative to a heavier reliance on cloud-based resources.

While many tasks may benefit from the utilization of an edge solution, some particular uses may be especially suited for deployment in such an environment. For example, devices like drones, autonomous cars, robots, and others may require extremely rapid processing—so fast, in fact, that sending data up to a cloud environment and back to receive data processing support may simply be too slow. Likewise, machines like locomotives and gas turbines that generate large amounts of information through the use of a wide array of data-generating sensors may benefit from the rapid data processing capabilities of an edge solution. As an additional example, some IoT devices such as connected video cameras may not be well-suited for the utilization of cloud-based resources as it may be impractical (not only from a privacy perspective, security perspective, or a financial perspective) to send the data to the cloud simply because of the pure volume of data that is involved. As such, many tasks that really on data processing, storage, or communications may be better suited by platforms that include edge solutions such as the storage systems described above.

Consider a specific example of inventory management in a warehouse, distribution center, or similar location. A large inventory, warehousing, shipping, order-fulfillment, manufacturing or other operation has a large amount of inventory on inventory shelves, and high resolution digital cameras that produce a firehose of large data. All of this data may be taken into an image processing system, which may reduce the amount of data to a firehose of small data. All of the small data may be stored on-premises in storage. The on-premises storage, at the edge of the facility, may be coupled to the cloud, for external reports, real-time control and cloud storage. Inventory management may be performed with the results of the image processing, so that inventory can be tracked on the shelves and restocked, moved, shipped, modified with new products, or discontinued/obsolescent products deleted, etc. The above scenario is a prime candidate for an embodiment of the configurable processing and storage systems described above. A combination of compute-only blades and offload blades suited for the image processing, perhaps with deep learning on offload-FPGA or offload-custom blade(s) could take in the firehose of large data from all of the digital cameras, and produce the firehose of small data. All of the small data could then be stored by storage nodes, operating with storage units in whichever combination of types of storage blades best handles the data flow. This is an example of storage and function acceleration and integration. Depending on external communication needs with the cloud, and external processing in the cloud, and depending on reliability of network connections and cloud resources, the system could be sized for storage and compute management with bursty workloads and variable conductivity reliability. Also, depending on other inventory management aspects, the system could be configured for scheduling and resource management in a hybrid edge/cloud environment.

The storage systems described above may alone, or in combination with other computing resources, serves as a network edge platform that combines compute resources, storage resources, networking resources, cloud technologies and network virtualization technologies, and so on. As part of the network, the edge may take on characteristics similar to other network facilities, from the customer premise and backhaul aggregation facilities to Points of Presence (PoPs) and regional data centers. Readers will appreciate that network workloads, such as Virtual Network Functions (VNFs) and others, will reside on the network edge platform. Enabled by a combination of containers and virtual machines, the network edge platform may rely on controllers and schedulers that are no longer geographically co-located with the data processing resources. The functions, as microservices, may split into control planes, user and data planes, or even state machines, allowing for independent optimization and scaling techniques to be applied. Such user and data planes may be enabled through increased accelerators, both those residing in server platforms, such as FPGAs and Smart NICs, and through SDN-enabled merchant silicon and programmable ASICs.

The storage systems described above may also be optimized for use in big data analytics. Big data analytics may be generally described as the process of examining large and varied data sets to uncover hidden patterns, unknown correlations, market trends, customer preferences and other useful information that can help organizations make more-informed business decisions. Big data analytics applications enable data scientists, predictive modelers, statisticians and other analytics professionals to analyze growing volumes of structured transaction data, plus other forms of data that are often left untapped by conventional business intelligence (BI) and analytics programs. As part of that process, semi-structured and unstructured data such as, for example, internet clickstream data, web server logs, social media content, text from customer emails and survey responses, mobile-phone call-detail records, IoT sensor data, and other data may be converted to a structured form. Big data analytics is a form of advanced analytics, which involves complex applications with elements such as predictive models, statistical algorithms and what-if analyses powered by high-performance analytics systems.

The storage systems described above may also support (including implementing as a system interface) applications that perform tasks in response to human speech. For example, the storage systems may support the execution intelligent personal assistant applications such as, for example, Amazon's Alexa, Apple Siri, Google Voice, Samsung Bixby, Microsoft Cortana, and others. While the examples described in the previous sentence make use of voice as input, the storage systems described above may also support chatbots, talkbots, chatterbots, or artificial conversational entities or other applications that are configured to conduct a conversation via auditory or textual methods. Likewise, the storage system may actually execute such an application to enable a user such as a system administrator to interact with the storage system via speech. Such applications are generally capable of voice interaction, music playback, making to-do lists, setting alarms, streaming podcasts, playing audiobooks, and providing weather, traffic, and other real time information, such as news, although in embodiments in accordance with the present disclosure, such applications may be utilized as interfaces to various system management operations.

The storage systems described above may also implement AI platforms for delivering on the vision of self-driving storage. Such AI platforms may be configured to deliver global predictive intelligence by collecting and analyzing large amounts of storage system telemetry data points to enable effortless management, analytics and support. In fact, such storage systems may be capable of predicting both capacity and performance, as well as generating intelligent advice on workload deployment, interaction and optimization. Such AI platforms may be configured to scan all incoming storage system telemetry data against a library of issue fingerprints to predict and resolve incidents in real-time, before they impact customer environments, and captures hundreds of variables related to performance that are used to forecast performance load.

The storage systems described above may support the serialized or simultaneous execution artificial intelligence applications, machine learning applications, data analytics applications, data transformations, and other tasks that collectively may form an AI ladder. Such an AI ladder may effectively be formed by combining such elements to form a complete data science pipeline, where exist dependencies between elements of the AI ladder. For example, AI may require that some form of machine learning has taken place, machine learning may require that some form of analytics has taken place, analytics may require that some form of data and information architecting has taken place, and so on. As such, each element may be viewed as a rung in an AI ladder that collectively can form a complete and sophisticated AI solution.

The storage systems described above may also, either alone or in combination with other computing environments, be used to deliver an AI everywhere experience where AI permeates wide and expansive aspects of business and life. For example, AI may play an important role in the delivery of deep learning solutions, deep reinforcement learning solutions, artificial general intelligence solutions, autonomous vehicles, cognitive computing solutions, commercial UAVs or drones, conversational user interfaces, enterprise taxonomies, ontology management solutions, machine learning solutions, smart dust, smart robots, smart workplaces, and many others. The storage systems described above may also, either alone or in combination with other computing environments, be used to deliver a wide range of transparently immersive experiences where technology can introduce transparency between people, businesses, and things. Such transparently immersive experiences may be delivered as augmented reality technologies, connected homes, virtual reality technologies, brain—computer interfaces, human augmentation technologies, nanotube electronics, volumetric displays, 4D printing technologies, or others. The storage systems described above may also, either alone or in combination with other computing environments, be used to support a wide variety of digital platforms. Such digital platforms can include, for example, 5G wireless systems and platforms, digital twin platforms, edge computing platforms, IoT platforms, quantum computing platforms, serverless PaaS, software-defined security, neuromorphic computing platforms, and so on.

The storage systems described above may also be part of a multi-cloud environment in which multiple cloud computing and storage services are deployed in a single heterogeneous architecture. In order to facilitate the operation of such a multi-cloud environment, DevOps tools may be deployed to enable orchestration across clouds. Likewise, continuous development and continuous integration tools may be deployed to standardize processes around continuous integration and delivery, new feature rollout and provisioning cloud workloads. By standardizing these processes, a multi-cloud strategy may be implemented that enables the utilization of the best provider for each workload. Furthermore, application monitoring and visibility tools may be deployed to move application workloads around different clouds, identify performance issues, and perform other tasks. In addition, security and compliance tools may be deployed for to ensure compliance with security requirements, government regulations, and so on. Such a multi-cloud environment may also include tools for application delivery and smart workload management to ensure efficient application delivery and help direct workloads across the distributed and heterogeneous infrastructure, as well as tools that ease the deployment and maintenance of packaged and custom applications in the cloud and enable portability amongst clouds. The multi-cloud environment may similarly include tools for data portability.

The storage systems described above may be used as a part of a platform to enable the use of crypto-anchors that may be used to authenticate a product's origins and contents to ensure that it matches a blockchain record associated with the product. Such crypto-anchors may take many forms including, for example, as edible ink, as a mobile sensor, as a microchip, and others. Similarly, as part of a suite of tools to secure data stored on the storage system, the storage systems described above may implement various encryption technologies and schemes, including lattice cryptography. Lattice cryptography can involve constructions of cryptographic primitives that involve lattices, either in the construction itself or in the security proof. Unlike public-key schemes such as the RSA, Diffie-Hellman or Elliptic-Curve cryptosystems, which are easily attacked by a quantum computer, some lattice-based constructions appear to be resistant to attack by both classical and quantum computers.

A quantum computer is a device that performs quantum computing. Quantum computing is computing using quantum-mechanical phenomena, such as superposition and entanglement. Quantum computers differ from traditional computers that are based on transistors, as such traditional computers require that data be encoded into binary digits (bits), each of which is always in one of two definite states (0 or 1). In contrast to traditional computers, quantum computers use quantum bits, which can be in superpositions of states. A quantum computer maintains a sequence of qubits, where a single qubit can represent a one, a zero, or any quantum superposition of those two qubit states. A pair of qubits can be in any quantum superposition of 4 states, and three qubits in any superposition of 8 states. A quantum computer with n qubits can generally be in an arbitrary superposition of up to $2^{\wedge}n$ different states simultaneously, whereas a traditional computer can only be in one of these states at any one time. A quantum Turing machine is a theoretical model of such a computer.

For further explanation, FIG. 4 sets forth a flow chart illustrating an example method for migrating data (416) in a storage system (402) that includes a plurality of storage devices (412, 414) according to embodiments of the present disclosure. Although depicted in less detail, the storage system (402) depicted in FIG. 4 may be similar to the storage systems described above with reference to FIGS. 1-3. The storage system (402) may therefore include a plurality of controllers, storage devices, write buffer devices, and so on. Readers will appreciate that the storage system (402) depicted in FIG. 4 may also be part of a larger storage system that includes a plurality of storage systems.

The example method depicted in FIG. 4 includes detecting (404), by the storage system (402), an occurrence of a storage device evacuation event associated with one or more source storage devices (412). A storage device evacuation event may indicate that the one or more source storage devices (412) should no longer be written to as the one or more source storage devices (412) will ultimately be removed from the storage system (402). Before the one or more source storage devices (412) are removed from the storage system (402), however, valid data on the one or more source storage devices (412) should be relocated to other storage devices (414) in the storage system (402). The storage device evacuation event may be embodied, for example, as an event that is generated in response to a system administrator or other administrative entity indicating that the one or more source storage devices (412) are designated for removal from the storage system (402). The system administrator or other administrative entity may indicate that the one or more source storage devices (412) are designated for removal from the storage system (402), for example, through the use of a special purpose user interface (e.g., a GUI presented on a display screen) that presents an inventory of the storage devices (412, 414) that are included in the storage system (402) and that also allowed the user of the special purpose user interface to select one or more source storage devices (412) that are to be designated for removal from the storage system (402).

In the example method depicted in FIG. 4, detecting (404) an occurrence of a storage device evacuation event associated with one or more source storage devices (412) may be carried out by a special purpose module of computer program instructions that is executing on computer hardware within the storage system (402). Such a special purpose module of computer program instructions may be a standalone module or may be included within a larger module such as, for example, the array operating environment described above with reference to FIG. 2. Such a special purpose module of computer program instructions may be executing, for example, on one or more computer processors within an array management server, on one or more computer processors within a storage array controller that is similar to the storage array controllers described above, or on other computer hardware within the storage system (402).

Readers will appreciate that one or more source storage devices (412) may be designated for removal from the storage system (402) for a variety of reasons. For example, the more source storage devices (412) may be relatively old storage devices that have a smaller storage capacity than relatively new storage devices that may be available as replacements for the relatively old storage devices. Alternatively, the more source storage devices (412) may be relatively old storage devices that have higher access latencies and can't perform as many TOPS as relatively new storage devices that may be available as replacements for the relatively old storage devices. The one or more source storage devices (412) may therefore be designated for removal from the storage system (402) as part of an upgrade to the storage system (402). Readers will appreciate that the one or more source storage devices (412) may be designated for removal from the storage system (402) for other reasons, and readers will further appreciate that the one or more source storage devices (412) may be designated for removal from the storage system (402) in spite of the fact that the one or more source storage devices (412) may still be properly functioning with no indication that a failure of the one or more source storage devices (412) is imminent.

The example method depicted in FIG. 4 also includes identifying (406), by the storage system (402), one or more target storage devices (414) for receiving data (416) stored on the one or more source storage devices (412). Identifying (406) one or more target storage devices (414) for receiving data (416) stored on the one or more source storage devices (412) may be carried out by a special purpose module of computer program instructions that is executing on computer hardware within the storage system (402). Such a special purpose module of computer program instructions may be a standalone module or may be included within a larger module such as, for example, the array operating environment described above with reference to FIG. 2. Such a special purpose module of computer program instructions may be executing, for example, on one or more computer processors within an array management server, on one or more computer processors within a storage array controller that is similar to the storage array controllers described above, or on other computer hardware within the storage system (402).

In the example method depicted in FIG. 4, identifying (406) one or more target storage devices (414) for receiving data (416) stored on the one or more source storage devices (412) is carried out in response to detecting the occurrence of the storage device evacuation event. Upon detecting the occurrence of the storage device evacuation event, the storage system (402) may identify (406) the one or more target storage devices (414) for receiving data (416) stored on the one or more source storage devices (412) by identifying the storage devices that are most physically proximate to the source storage devices (412), by identifying the storage devices in the storage system (402) have the most available storage, and so on.

The example method depicted in FIG. 4 also includes reducing (408), by the storage system (402), write access to the one or more source storage devices (412). Reducing (408) write access to the one or more source storage devices (412) may be carried out, for example, by preventing any additional data from being written to the one or more source storage devices (412), by limiting the number of write accesses that may be directed to the one or more source storage devices (412) to a predetermined value, and so on. Readers will appreciate that by reducing (408) write access to the one or more source storage devices (412), the storage system (402) may continue to read data from the one or more source storage devices (412), but new data may not be written to the source storage devices (412) given that the new data will subsequently be migrated away from the source storage devices (412) in anticipation of removing the source storage devices (412) from the storage system (402).

Reducing (408) write access to the one or more source storage devices (412) may be carried out through the use of a special purpose module of computer program instructions that is executing on computer hardware within the storage system (402). Such a special purpose module of computer program instructions may be a standalone module or may be included within a larger module such as, for example, the array operating environment described above with reference to FIG. 2. Such a special purpose module of computer program instructions may be executing, for example, on one or more computer processors within an array management server, on one or more computer processors within a storage array controller that is similar to the storage array controllers described above, or on other computer hardware within the storage system (402). In such an example, the special purpose module of computer program instructions that is executing on computer hardware within the storage system (402) may be configured to notify each of the storage array controllers in the storage system (402) that write access to the one or more source storage devices (412) has been reduced (408), so that the storage array controllers in the storage system (402) may cease (or limit) issuing write requests to the one or more source storage devices (412).

The example method depicted in FIG. 4 also includes migrating (410) the data (416) stored on the one or more source storage devices (412) to the one or more target storage devices (414). Migrating (410) the data (416) stored on the one or more source storage devices (412) to the one or more target storage devices (414) may be carried out, for example, by writing the data (416) stored on the one or more source storage devices (412) to the one or more target storage devices (414). In such an example, once all valid data on the one or more source storage devices (412) has been migrated (410) to the one or more target storage devices (414), the one or more source storage devices (412) may be safely removed from the storage system (402). Once all of the valid data on the one or more source storage devices (412) has been migrated (410) to the one or more target storage devices (414), the source storage devices (412) may no longer considered part of quorum of storage devices. In fact, any storage devices that are inserted in place of the source storage devices (412) must be explicitly added through an enumeration process that may be carried out, for example, by an array operating environment that is executing on a particular storage array controller within the storage system (402). Such an enumeration process can be carried out by detecting the insertion of a device into the storage system (402), identifying that the inserted device is a storage device, and initializing the required routines or drivers that enable the storage devices to function. In such an example, detecting the insertion of a device into the storage system (402) may be carried out through the use of software detection mechanisms or hardware components (e.g., presence detect lines) that detect the physical presence of a device and signal the storage array controller when a device is inserted or removed from the storage system (402). Identifying that the inserted device is a storage device may be carried out, for example, by the storage array controller receiving information such as vital product data ('VPD') for the inserted device, where such VPD can be utilized by the array operating environment to identify the device. Once the device has been identified, the array operating environment may initialize drivers and routines necessary to access and utilize the device.

Readers will appreciate that if there is not sufficient space on the one or more target storage devices (414) to store the data (416) that is stored on the one or more source storage devices (412), migration (410) of the data (416) may be aborted and the storage system (402) may be rolled back to its state prior to the occurrence of the storage device evacuation event. In such an example, an array operating environment executing on a storage array controller may determine that insufficient space exists on the one or more target storage devices (414) if storing the data (416) on the one or more target storage devices (414) would cause the capacity utilization of the storage system (402) to exceed a predetermined threshold.

Readers will appreciate that in some embodiments, only the valid data that is stored on the one or more source storage devices (412) will be migrated (410) to the one or more target storage devices (414), as invalid data does not need to be retained by migrating (410) such invalid data to the one or more target storage devices (414). Consider an example in which a particular piece of data was stored at a first location within a source storage device (412). In such an example, assume that a request to modify the particular piece of data was subsequently received. In view of the fact that the source storage device (412) may be embodied as an SSD, modifying the particular piece of data cannot be accomplished by simply overwriting the data as would occur in a hard disk drive. Instead, the modified version of the particular piece of data would be written to a second location (which may or may not be on the same storage device) and the particular piece of data that was stored at the first location within the source storage device (412) would be marked as being invalid. As such, the source storage device (412) may include some invalid data that has not yet been garbage collected, and such invalid data does not need to be retained by migrating (410) the invalid data to the one or more target storage devices (414).

Figure 5:
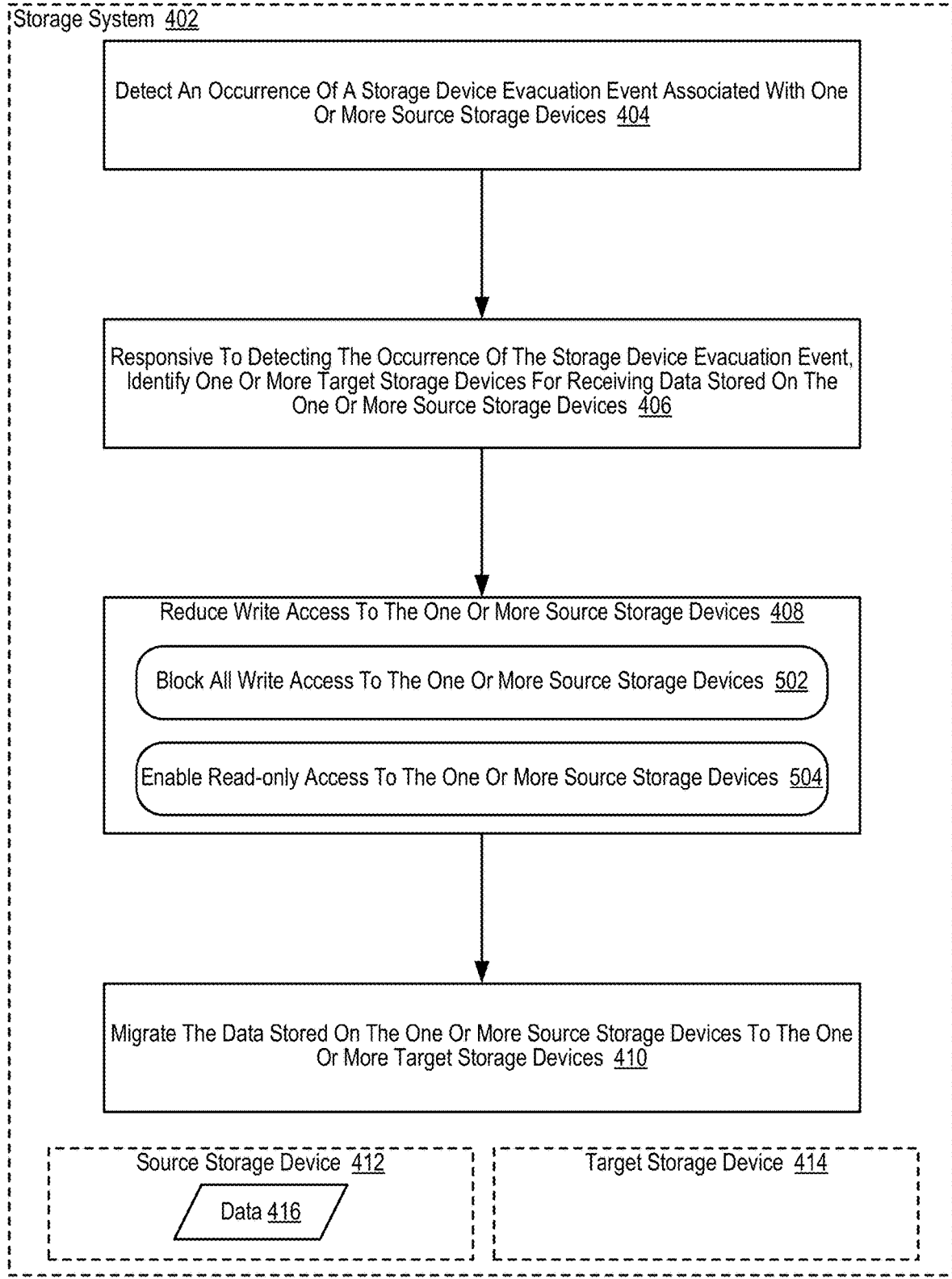
FIG. 5 sets forth a flow chart illustrating an additional example method for migrating data in a storage array that includes a plurality of storage devices according to embodiments of the present disclosure.

For further explanation, FIG. 5 sets forth a flow chart illustrating an additional example method for migrating data in a storage system that includes a plurality of storage devices according to embodiments of the present disclosure. The example method depicted in FIG. 5 is similar to the example method depicted in FIG. 4, as the example method depicted in FIG. 5 also includes detecting (404) an occurrence of a storage device evacuation event associated with one or more source storage devices (412), identifying (406) one or more target storage devices (414) for receiving data (416) stored on the one or more source storage devices (412), reducing (408) write access to the one or more source storage devices (412), and migrating (410) the data (416) stored on the one or more source storage devices (412) to the one or more target storage devices (414).

In the example method depicted in FIG. 5, reducing (408) write access to the one or more source storage devices (412) can include blocking (502) all write access to the one or more source storage devices (412). Blocking (502) all write access to the one or more source storage devices (412) may be carried out, for example, by each of the storage array controllers in the storage system (402) ceasing to issue write operations to the one or more source storage devices (412). In such an example, each storage array controller may maintain a list or other data structure that identifies all storage devices in the storage system (402) that should not be utilized to service write operations. Because the storage array controller is responsible for directing all access requests to the storage devices (412, 414) in the storage system (402), the storage array controller may ultimately enforce a policy to block (502) all write access to the one or more source storage devices (412).

In the example method depicted in FIG. 5, reducing (408) write access to the one or more source storage devices (412) can alternatively include enabling (504) read-only access to the one or more source storage devices (412). Enabling (504) read-only access to the one or more source storage devices (412) may be carried out, for example, by each of the storage array controllers in the storage system (402) ceasing to issue write operations to the one or more source storage devices (412) while also still allowing for read operations to be directed to the one or more source storage devices (412). In such an example, each storage array controller may maintain a list or other form of data repository that identifies all storage devices in the storage system (402) and associates access privileges (e.g., read-only, read-write) with each of the storage devices in the storage system (402). Because the storage array controller is responsible for directing all access requests to the storage devices (412, 414) in the storage system (402), the storage array controller may ultimately enforce a policy to enable (504) read-only access to the one or more source storage devices (412).

Readers will appreciate that in the examples described above, where write access to the one or more source storage devices (412) is reduced (408), the presence of deduplicated data on the one or more source storage devices (412) may be treated as a special case. Data deduplication is a data compression technique whereby duplicate copies of repeating data are eliminated. Through the use of data deduplication techniques, a unique chunk of data (e.g., the master copy) may be stored once in the storage system (402) and all additional occurrences of the chunk of data are replaced with a small reference that points to the stored chunk. The deduplicated data on the one or more source storage devices (412) may therefore be embodied, for example, as a piece of data that is stored on the one or more source storage devices (412), where the piece of data is pointed to by other occurrences of identical data in the storage system (402). The presence of deduplicated data on the one or more source storage devices (412) may be handled, for example, by allowing read-write access to the deduplicated data while enabling read-only access to (or blocking write access to) the remaining portions of the source storage devices (412) (e.g., those portions that do not contain deduplicated data). Alternatively, the deduplicated data may be migrated to another storage device in the storage array and all references to the deduplicated data may be updated to point to the new location where the deduplicated data is stored.

Figure 6:
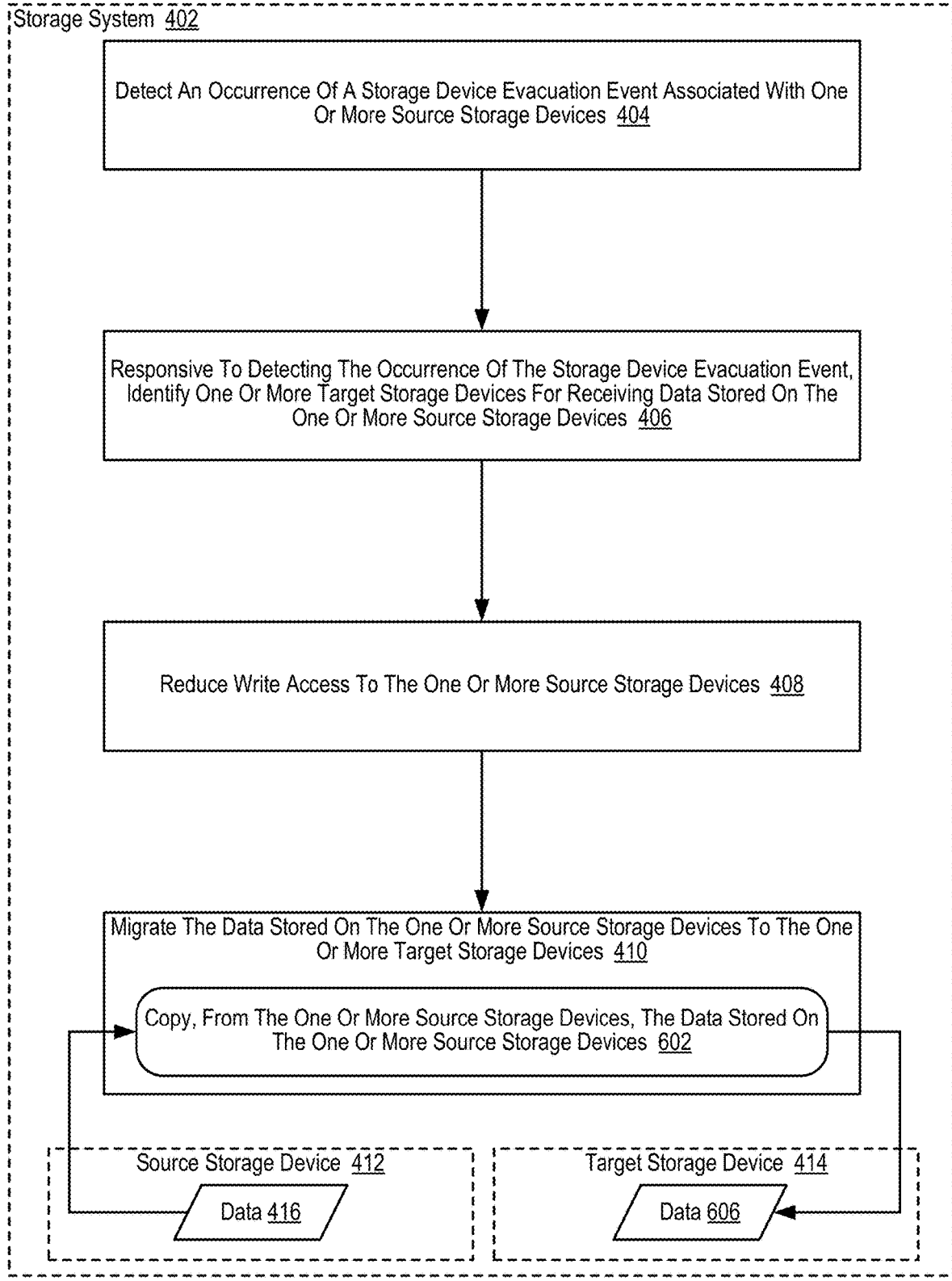
FIG. 6 sets forth a flow chart illustrating an additional example method for migrating data in a storage array that includes a plurality of storage devices according to embodiments of the present disclosure.

For further explanation, FIG. 6 sets forth a flow chart illustrating an additional example method for migrating data in a storage array that includes a plurality of storage devices according to embodiments of the present disclosure. The example method depicted in FIG. 6 is similar to the example method depicted in FIG. 4, as the example method depicted in FIG. 6 also includes detecting (404) an occurrence of a storage device evacuation event associated with one or more source storage devices (412), identifying (406) one or more target storage devices (414) for receiving data (416) stored on the one or more source storage devices (412), reducing (408) write access to the one or more source storage devices (412), and migrating (410) the data (416) stored on the one or more source storage devices (412) to the one or more target storage devices (414).

In the example method depicted in FIG. 6, migrating (410) the data (416) stored on the one or more source storage devices (412) to the one or more target storage devices (414) can include copying (602), from the one or more source storage devices (412) to the one or more target storage devices (414), the data (416) stored on the one or more source storage devices (412). Copying (602) the data (416) stored on the one or more source storage devices (412) from the one or more source storage devices (412) to the one or more target storage devices (414) may be carried out, for example, by the storage array controller reading the data (416) stored on the one or more source storage devices (412) and the storage array controller writing such data to the one or more target storage devices (414). In alternative embodiment, the storage array controller or even the drives themselves may be configured to support a copy operation that takes an identification of a source and an identification of a target as operands. In such an example, the operands may be specified as a range of physical addresses, a range of virtual addresses, a base address and an indication of the size of the data that is to be copied, an identification of a logical grouping of data such as a volume, and so on. Readers will appreciate that the example method depicted in FIG. 6 illustrates an embodiment where data (606) has been copied to the one or more target storage devices (414).

Figure 7:
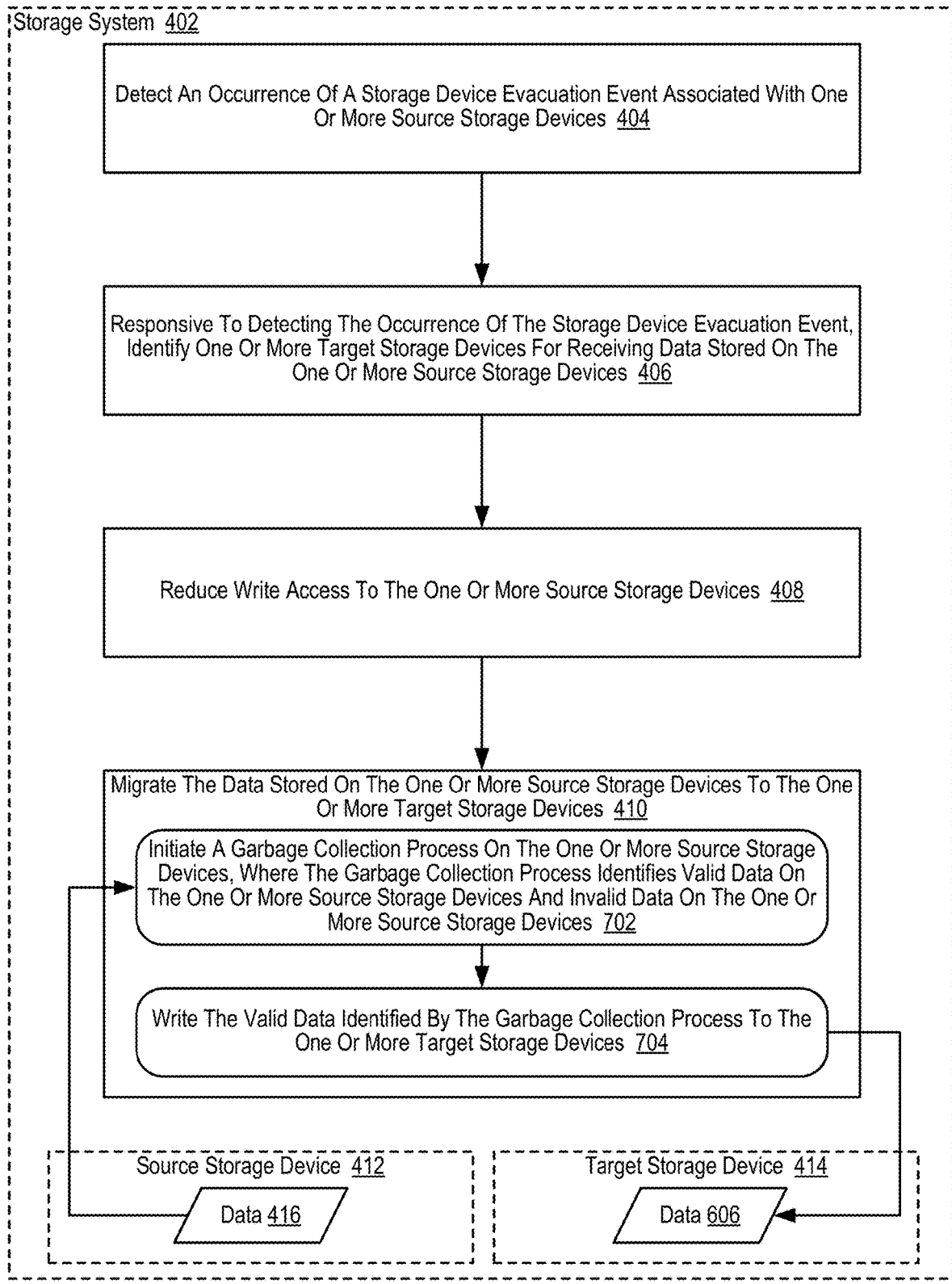
FIG. 7 sets forth a flow chart illustrating an additional example method for migrating data in a storage array that includes a plurality of storage devices according to embodiments of the present disclosure.

For further explanation, FIG. 7 sets forth a flow chart illustrating an additional example method for migrating data in a storage array that includes a plurality of storage devices according to embodiments of the present disclosure. The example method depicted in FIG. 7 is similar to the example method depicted in FIG. 4, as the example method depicted in FIG. 7 also includes detecting (404) an occurrence of a storage device evacuation event associated with one or more source storage devices (412), identifying (406) one or more target storage devices (414) for receiving data (416) stored on the one or more source storage devices (412), reducing (408) write access to the one or more source storage devices (412), and migrating (410) the data (416) stored on the one or more source storage devices (412) to the one or more target storage devices (414).

In the example method depicted in FIG. 7, migrating (410) the data (416) stored on the one or more source storage devices (412) to the one or more target storage devices (414) can include initiating (702) a garbage collection process on the one or more source storage devices (412). A garbage collection process may be embodied, for example, as a module of computer program instructions executing on computer hardware such as a computer processor or a microcontroller. The garbage collection process may be configured to reclaim memory that is occupied by data that is no longer in use. As described above, data that is no longer in use may be referred to herein as invalid data whereas data that is still in use may be referred to herein as valid data.

In the example method depicted in FIG. 7, the garbage collection process may identify valid data on the one or more source storage devices (412) and the garbage collection process can also identify invalid data on the one or more source storage devices (412). The garbage collection process may identify valid data on the one or more source storage devices (412) and the garbage collection process can also identify invalid data on the one or more source storage devices (412), for example, by reading metadata that is associated with data stored in the storage system (402). Such metadata can include information that can be used to determine whether a particular piece of data is valid or invalid. The metadata may include such information as the result of steps carried out by the storage array controller or the storage devices (412, 414) themselves when data is written to the storage devices (412, 414).

Consider an example in which the storage devices (412, 414) are embodied as SSDs where data is written to the SSDs in 16 KB pages. Attached to each page in the SSD may be a small amount (e.g., 8 Bytes) of additional memory that is used to store metadata associated with the page. The SSDs may be configured to receive requests to write data from the storage array controller, where the requests to write data include a virtual address that the SSD subsequently translates into a physical address. In such an example, the virtual-to-physical address translations may be stored by the SSD in a translation table that is maintained by the SSD. When the SSD receives a request to write data to a particular virtual address, the SSD may write the data to a first page that is associated with a first physical address and the SSD may also set a predetermined bit in the small amount of additional memory that is used to store metadata associated with the first page to a value indicating that the data contained therein is valid. If the SSD subsequently receives a second request to write data to the particular virtual address, the SSD may write the data to a second page that is described by a second physical address and also set a predetermined bit in the small amount of additional memory that is used to store metadata associated with the second page to a value indicating that the data contained therein is valid. In addition, the SSD may set the predetermined bit in the small amount of additional memory that is used to store metadata associated with the first page to a value indicating that the data contained therein is invalid, while also updating the translation table to map the particular virtual address to the second physical address. In such a way, the garbage collection process may scan the metadata associated with each page to determine whether the contents of each page are valid or invalid. Readers will appreciate that in other embodiments, metadata that is associated with data stored in the storage system (402) may be stored and maintained in other ways.

In the example method depicted in FIG. 7, migrating (410) the data (416) stored on the one or more source storage devices (412) to the one or more target storage devices (414) can also include writing (704) the valid data identified by the garbage collection process to the one or more target storage devices (414). Writing (704) the valid data identified by the garbage collection process to the one or more target storage devices (414) may be carried out, for example, by a storage array controller issuing one or more instructions to write the valid data identified by the garbage collection process to the one or more target storage devices (414). In such an example, writing (704) the valid data identified by the garbage collection process to the one or more target storage devices (414) may even be part of the garbage collection process as the garbage collection process can communicate with other modules on a storage array to facilitate writing (704) the valid data identified by the garbage collection process to the one or more target storage devices (414). Readers will appreciate that the example method depicted in FIG. 7 illustrates an embodiment where data (606) has been migrated to the one or more target storage devices (414) via the garbage collection process.

Figure 8:
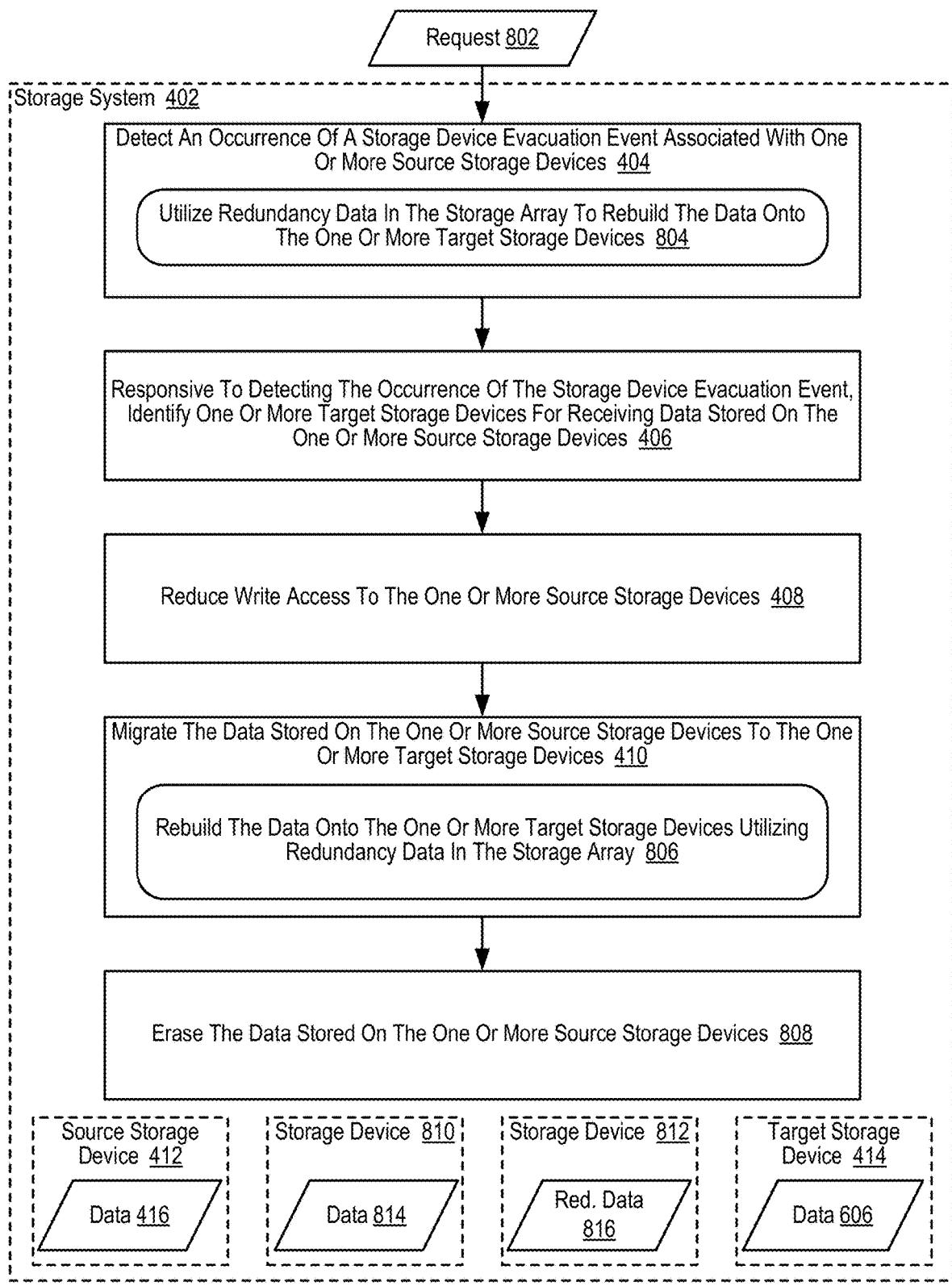
FIG. 8 sets forth a flow chart illustrating an additional example method for migrating data in a storage array that includes a plurality of storage devices according to embodiments of the present disclosure.

For further explanation, FIG. 8 sets forth a flow chart illustrating an additional example method for migrating data in a storage array that includes a plurality of storage devices according to embodiments of the present disclosure. The example method depicted in FIG. 8 is similar to the example method depicted in FIG. 4, as the example method depicted in FIG. 8 also includes detecting (404) an occurrence of a storage device evacuation event associated with one or more source storage devices (412), identifying (406) one or more target storage devices (414) for receiving data (416) stored on the one or more source storage devices (412), reducing (408) write access to the one or more source storage devices (412), and migrating (410) the data (416) stored on the one or more source storage devices (412) to the one or more target storage devices (414).

In the example method depicted in FIG. 8, detecting (404) an occurrence of a storage device evacuation event associated with one or more source storage devices (412) can include receiving (804) a user-initiated request (802) to migrate data away from the one or more source storage devices (412). The user-initiated request (802) to migrate data away from the one or more source storage devices (412) may be received (804), for example, through the use a user interface (e.g., a GUI presented on a display screen) that presents an inventory of the storage devices (412, 414) that are included in the storage system (402) and that also allows the user of the user interface to select one or more source storage devices (412) that are to be designated for removal from the storage system (402). Readers will appreciate that a user-initiated request (802) to migrate data away from the one or more source storage devices (412) may be received (804) in other ways in other embodiments.

In the example method depicted in FIG. 8, the data (416) that is stored on the one or more source storage devices (412) may be part of a data set that is striped across a plurality of storage devices. For example, the data (416) that is stored on the one or more source storage devices (412) may be part of a RAID stripe where data (814) that is stored on another storage device (810) is part of the RAID stripe. In such an example, redundancy data (816) may be stored on another storage device (812) in the storage system (402). Such redundancy data (816) may be used to rebuild data (416, 814) in the RAID stripe in the event that one of the storage devices (412, 810) that contain the data (416, 814) fails or otherwise becomes unavailable.

In the example method depicted in FIG. 8, migrating (410) the data (416) stored on the one or more source storage devices (412) to the one or more target storage devices (414) can include rebuilding (806) the data (416) onto the one or more target storage devices (414) utilizing redundancy data (816) in the storage system (402). Rebuilding (806) the data (416) onto the one or more target storage devices (414) may be carried out, for example, by utilizing RAID algorithms and the redundancy data (816) to rebuild the data (416) that is stored on the one or more source storage devices (412). In the example method depicted in FIG. 8, however, the one or more target storage devices (414) may be identified as the destination where the data rebuilt data will be stored.

The example method depicted in FIG. 8 also includes erasing (808) the data (416) stored on the one or more source storage devices (412). Erasing (808) the data (416) stored on the one or more source storage devices (412) may be carried out once the data (416) stored on the one or more source storage devices (412) has been successfully migrated to the one or more target storage devices (414). Erasing (808) the data (416) stored on the one or more source storage devices (412) may be carried out as a data protection measure, to ensure that once the storage devices (412) have been removed from the storage system (402), client data that resides on those storage devices (412) will not be accessed. Readers will appreciate that the example method depicted in FIG. 8 illustrates an embodiment where data (606) has been rebuilt onto the one or more target storage devices (414).

Figure 9:
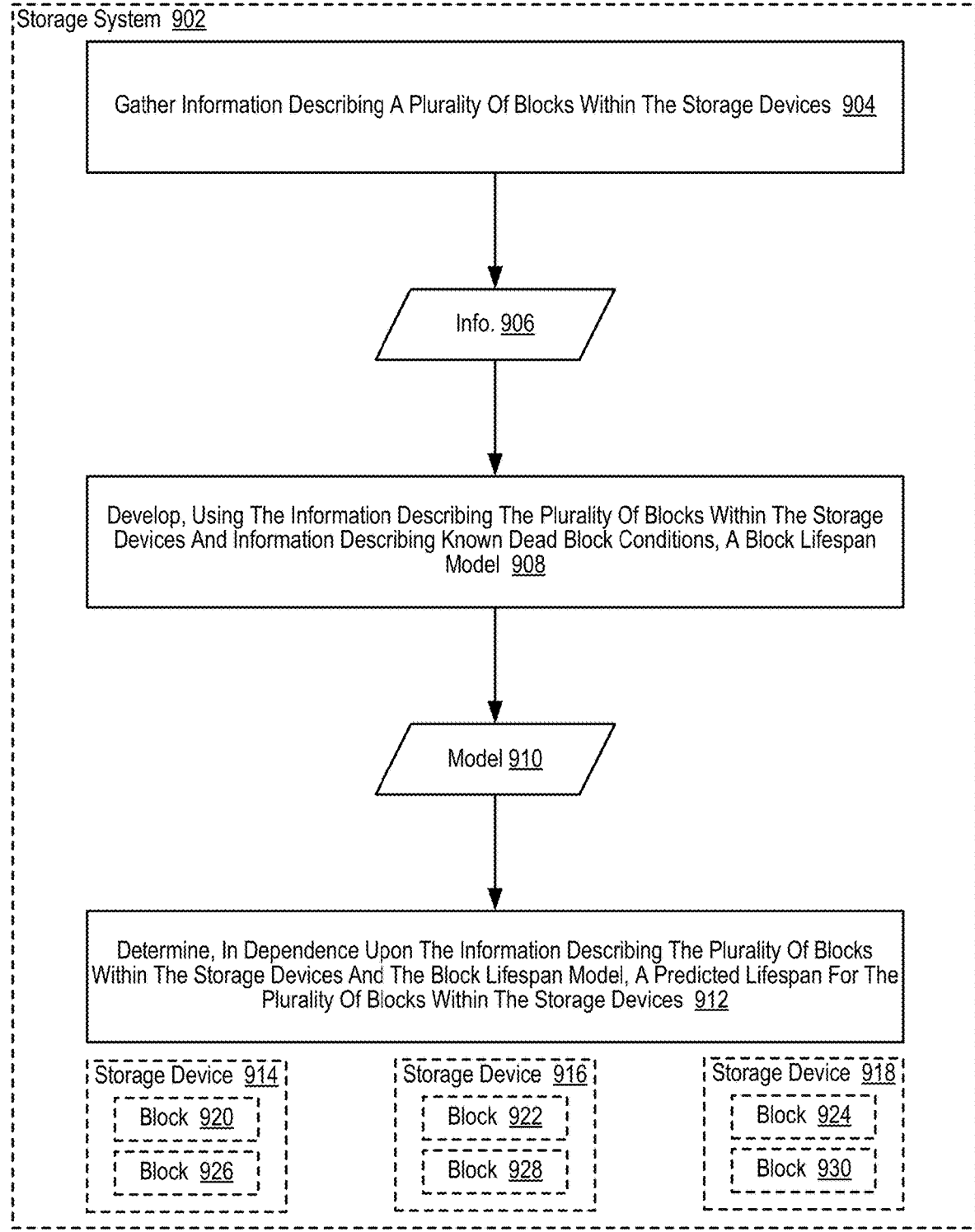
FIG. 9 sets forth a flow chart illustrating an example method of predicting failures in a storage system that includes a plurality of storage devices according to some embodiments of the present disclosure.

For further explanation, FIG. 9 sets forth a flow chart illustrating an example method of predicting failures in a storage system (902) that includes a plurality of storage devices (914, 916, 918) according to some embodiments of the present disclosure. Although depicted in less detail, the storage system (902) depicted in FIG. 9 may be similar to the storage systems described above, and may include any combination of the components described above.

The example method depicted in FIG. 9 includes gathering (904) information (906) describing a plurality of blocks (920, 922, 924, 926, 928, 930) within the storage devices (914, 916, 918). Each of the blocks (920, 922, 924, 926, 928, 930) within the storage devices (914, 916, 918) may be embodied, for example, as an erase block within an SSD. In such an example, each block (920, 922, 924, 926, 928, 930) may contain a specified number of pages (e.g., 32 pages, 128 pages, 256 pages), which in turn may be capable of storing a specified amount of data (e.g., 2 K, 4 K, 8 K). Unlike traditional rotating hard drives, data in an SSD may not be directly overwritten and as a consequence, the amount of data that may be written in a single operation may be of one size (a page) and data that may be erased in a single operation may be of another size (a block).

In the example method depicted in FIG. 9, the information (906) describing the plurality of blocks (920, 922, 924, 926, 928, 930) within the storage devices (914, 916, 918) may include many disparate types of information. The information (906) describing the plurality of blocks (920, 922, 924, 926, 928, 930) within the storage devices (914, 916, 918) may include, for example, information describing the age of a particular block (920, 922, 924, 926, 928, 930), information describing the average temperature of a die that supports a particular block (920, 922, 924, 926, 928, 930), the number of times that a particular block (920, 922, 924, 926, 928, 930) has been read from, the number of times that a particular block (920, 922, 924, 926, 928, 930) has been erased, the bit error rate associated with a particular block (920, 922, 924, 926, 928, 930), the type of underlying circuitry that supports a particular block (920, 922, 924, 926, 928, 930), the amount of time since a particular block (920, 922, 924, 926, 928, 930) was last programmed, the voltage offset associated with a particular block (920, 922, 924, 926, 928, 930), and many other types of information. In such an example, the information (906) describing the plurality of blocks (920, 922, 924, 926, 928, 930) within the storage devices (914, 916, 918) may be gathered (906), for example, by scanning the storage devices and extracting such information from metadata maintained on the storage devices themselves.

The example method depicted in FIG. 9 also includes developing (908), using the information (906) describing the plurality of blocks (920, 922, 924, 926, 928, 930) within the storage devices (914, 916, 918) and information describing known dead block conditions, a block lifespan model (910). The block lifespan model (910) in FIG. 9 may be embodied, for example, as a mathematical model that serves as a description of a system using mathematical concepts and language. The block lifespan model (910) may be the artifact that is created by using a machine learning process and may be used to gain predictions on new data for which a target is unknown. For example, to train a model to predict if an email is spam or not spam, training data may be provided that contains emails for which you know the target (that is, a label that tells whether an email is spam or not spam). Readers will appreciate that such models may be generally classified, for example, as binary classification models, multiclass classification models, and regression models. In the example method depicted in FIG. 9, the block lifespan model (910) may be generated by using training data that identifies the characteristics of blocks that have failed as well as the characteristics of blocks that have not failed, so that a model may be created that can predict when blocks will be expected to fail.

The example method depicted in FIG. 9 also includes determining (912), in dependence upon the information (906) describing the plurality of blocks (920, 922, 924, 926, 928, 930) within the storage devices (914, 916, 918) and the block lifespan model (910), a predicted lifespan for the plurality of blocks (920, 922, 924, 926, 928, 930) within the storage devices (914, 916, 918). Determining (912) a predicted lifespan for the plurality of blocks (920, 922, 924, 926, 928, 930) within the storage devices (914, 916, 918) in dependence upon the information (906) describing the plurality of blocks (920, 922, 924, 926, 928, 930) within the storage devices (914, 916, 918) and the block lifespan model (910) may be carried out, for example, by applying the block lifespan model (910) to the information (906) describing the plurality of blocks (920, 922, 924, 926, 928, 930) within the storage devices (914, 916, 918). In such an example, the information (906) describing the plurality of blocks (920, 922, 924, 926, 928, 930) within the storage devices (914, 916, 918) may be evaluated in view of the block lifespan model (910) in order to predict how much additional lifespan that each block (920, 922, 924, 926, 928, 930) would be expected to have.

Figure 10:
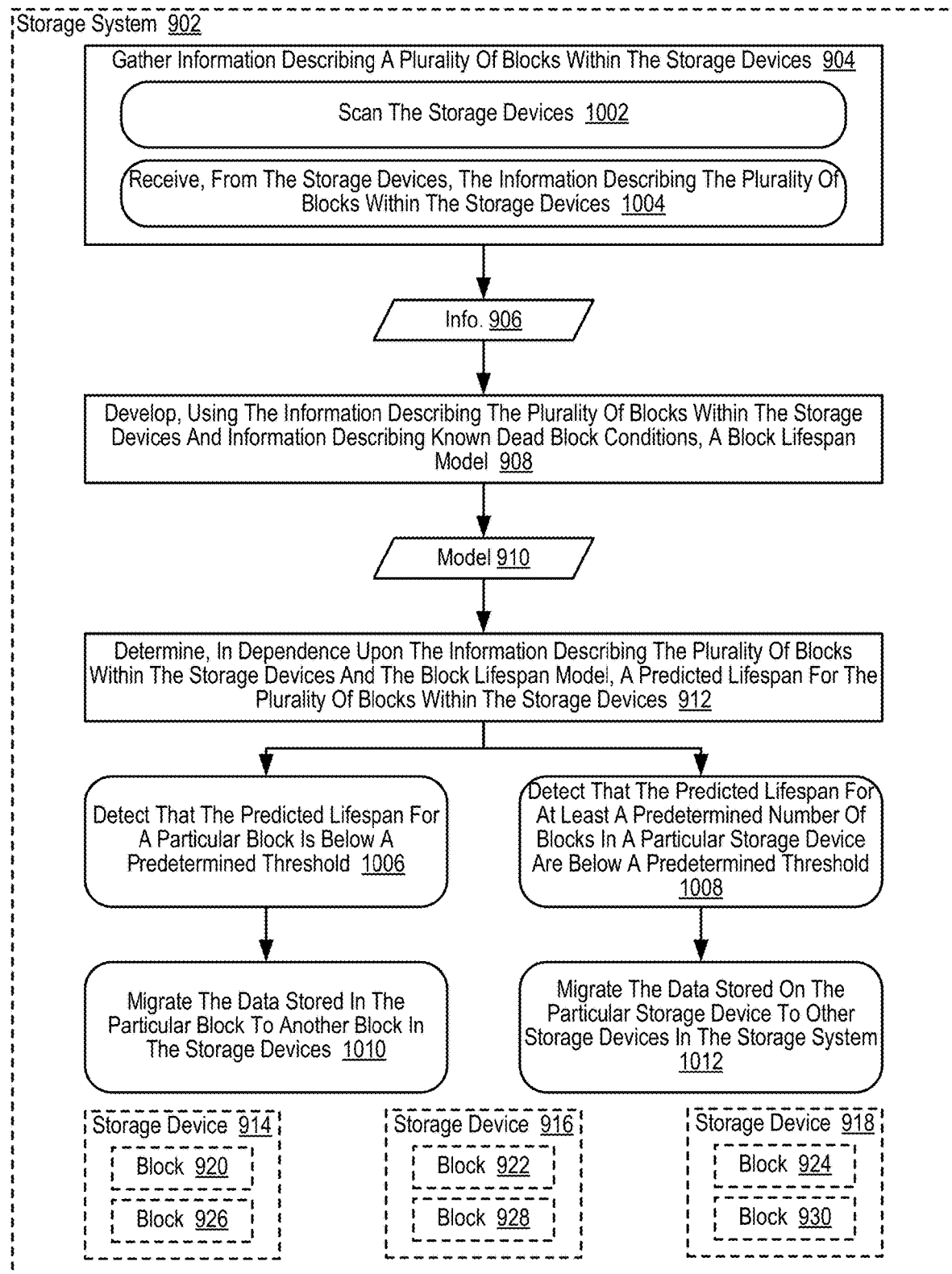
FIG. 10 sets forth a flow chart illustrating an additional example method of predicting failures in a storage system that includes a plurality of storage devices according to some embodiments of the present disclosure.

For further explanation, FIG. 10 sets forth a flow chart illustrating an additional example method of predicting failures in a storage system (902) that includes a plurality of storage devices (914, 916, 918) according to some embodiments of the present disclosure. The example method depicted in FIG. 10 is similar to the example method depicted in FIG. 9, as the example method depicted in FIG. 10 also includes gathering (904) information (906) describing a plurality of blocks (920, 922, 924, 926, 928, 930) within the storage devices (914, 916, 918), developing (908) a block lifespan model (910) using the information (906) describing the plurality of blocks (920, 922, 924, 926, 928, 930) within the storage devices (914, 916, 918) and information describing known dead block conditions, and determining (912), in dependence upon the information (906) describing the plurality of blocks (920, 922, 924, 926, 928, 930) within the storage devices (914, 916, 918) and the block lifespan model (910), a predicted lifespan for the plurality of blocks (920, 922, 924, 926, 928, 930) within the storage devices (914, 916, 918).

In the example method depicted in FIG. 10, gathering (904) information (906) describing a plurality of blocks (920, 922, 924, 926, 928, 930) within the storage devices (914, 916, 918) can include scanning (1002) the storage devices (914, 916, 918). Scanning (1002) the storage devices (914, 916, 918) may be carried, for example, through the use of computer program instructions executing on computer hardware that can examine each of the blocks (920, 922, 924, 926, 928, 930) within the storage devices (914, 916, 918). In such an example, information may be maintained on the storage device (e.g., in a header that is attached to each page) that contains information such as, for example, a block type, a block state, a last page programmed, an error mask, read distribution counts, program/erase counts, bit error rates, and other information. In such an example, scanning (1002) the storage devices (914, 916, 918) may be carried out by reading such information from each storage device to gather such information on a block-by-block basis.

In the example method depicted in FIG. 10, gathering (904) information (906) describing a plurality of blocks (920, 922, 924, 926, 928, 930) within the storage devices (914, 916, 918) can also include receiving (1004), from the storage devices (914, 916, 918), the information (906) describing the plurality of blocks (920, 922, 924, 926, 928, 930) within the storage devices (914, 916, 918). In the example method depicted in FIG. 10, given that each storage device may maintain various forms of information (906) describing a plurality of blocks (920, 922, 924, 926, 928, 930) contained therein, the storage devices may be configured to support one or more special purpose commands designed to extract such information from the storage devices. As such, receiving (1004), from the storage devices (914, 916, 918), the information (906) describing the plurality of blocks (920, 922, 924, 926, 928, 930) within the storage devices (914, 916, 918) may be carried out by issuing such commands to the storage devices and receiving a response from the storage devices that includes information (906) describing a plurality of blocks (920, 922, 924, 926, 928, 930) within the storage devices (914, 916, 918).

The example method depicted in FIG. 10 also includes detecting (1006) that the predicted lifespan for a particular block (920, 922, 924, 926, 928, 930) is below a predetermined threshold. The predicted lifespan for a particular block (920, 922, 924, 926, 928, 930) may be expressed in absolute terms such as, for example, a number of seconds, minutes, hours, or other unit of measure until the particular block (920, 922, 924, 926, 928, 930) is predicted to fail. Alternatively, the predicted lifespan for a particular block (920, 922, 924, 926, 928, 930) may be expressed in relative terms such as, for example, a scale from zero to ten where zero represents a prediction that a failure of the particular block (920, 922, 924, 926, 928, 930) is imminent whereas ten represents a prediction that a failure of the particular block (920, 922, 924, 926, 928, 930) is so distant as to not be a concern. In such an example, thresholds may be set by a system administrator or other entity and may be compared to the predicted lifespan for a particular block (920, 922, 924, 926, 928, 930) to determine whether the predicted lifespan for a particular block (920, 922, 924, 926, 928, 930) is below the threshold. Readers will appreciate that although this paragraph described embodiments where the predicted lifespan for a particular block (920, 922, 924, 926, 928, 930) is below a predetermined threshold, in other embodiments the predicted lifespan for a particular block (920, 922, 924, 926, 928, 930) may be above a predetermined threshold, the predicted lifespan for a particular block (920, 922, 924, 926, 928, 930) may be within a predetermined range, and so on—so long as the predicted lifespan for a particular block (920, 922, 924, 926, 928, 930) is short enough in comparison to some predetermined value(s) so as to warrant remedial action in view of the fact that the particular block (920, 922, 924, 926, 928, 930) is a candidate for relatively immediate failure.

The example method depicted in FIG. 10 also includes migrating (1010) the data stored in the particular block (920, 922, 924, 926, 928, 930) to another block in the storage devices. Migrating (1010) the data stored in the particular block (920, 922, 924, 926, 928, 930) to another block in the storage devices may be carried out, for example, using the data migration techniques described above. In such an example, data stored in the particular block (920, 922, 924, 926, 928, 930) whose predicted lifespan is below a predetermined threshold may be migrated to another block on the same storage device as the particular block (920, 922, 924, 926, 928, 930) or migrated to another block on a different storage devices as the particular block (920, 922, 924, 926, 928, 930).

The example method depicted in FIG. 10 also includes detecting (1008) that the predicted lifespan for at least a predetermined number of blocks in a particular storage device are below a predetermined threshold. In the example method depicted in FIG. 10, the predicted lifespan for at least a predetermined number of blocks in a particular storage device being below a predetermined threshold may indicate that the storage device is unreliable, that the performance delivered by the storage device is below acceptable levels, or that the storage device is otherwise in need of replacement. As such, detecting (1008) that the predicted lifespan for at least a predetermined number of blocks in a particular storage device are below a predetermined threshold may trigger remedial actions. Readers will appreciate that although this paragraph described embodiments where the predicted lifespan for at least a predetermined number of blocks in a particular storage device are below a predetermined threshold, in other embodiments thresholds may be set in other ways—so long as the number of blocks in a particular device that are predicted to fail or otherwise be unreliable is large enough so as to warrant remedial action in view of the fact that the particular storage device is a candidate for relatively immediate replacement. The example method depicted in FIG. 10 also includes migrating (1012) the data stored on the particular storage device to other storage devices in the storage system. Migrating (1012) the data stored on the particular storage device to other storage devices in the storage system may be carried out, for example, using the data migration techniques described above.

Readers will appreciate that although the example methods described above are depicted in a way where a series of steps occurs in a particular order, no particular ordering of the steps is required unless explicitly stated. Example embodiments of the present invention are described largely in the context of a fully functional computer system for migrating data in a storage system that includes a plurality of storage devices. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the example embodiments described in this specification are oriented to software installed and executing on computer hardware, nevertheless, alternative embodiments implemented as firmware or as hardware are well within the scope of the present invention.

The present invention may be embodied as an apparatus, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, RAM, a read-only memory (ROM), an erasable programmable read-only memory (EPROM or Flash memory), a static random access memory (SRAM), a portable compact disc read-only memory (CD-ROM), a digital versatile disk (DVD), a memory stick, and so on. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a wide area network (WAN), or the connection may be made to an external computer (for example, through the Internet using an Internet Service Provider). In some embodiments, electronic circuitry including, for example, programmable logic circuitry, FPGAs, or PLAs may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of apparatuses, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Readers will appreciate that the steps described herein may be carried out in a variety ways and that no particular ordering is required. It will be further understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method comprising:
    gathering, from headers attached to pages within each of a plurality of blocks within a plurality of storage devices in a storage system, information describing a previous state of the plurality of blocks;
    training a machine learning block lifespan model using the information, wherein the information identifies characteristics of one or more previously failed blocks of the plurality of blocks as well as characteristics of one or more other blocks of the plurality of blocks that have not previously failed;
    determining, based on the information describing the previous state of the plurality of blocks within the storage devices and the machine learning block lifespan model, a predicted lifespan for at least one block, of the plurality of blocks, that stores data;
    detecting that the predicted lifespan for the at least one block is below a predetermined block lifespan threshold; and
    based on the detection, migrating the data stored in the at least one block therefrom.

2. The method of claim 1 wherein gathering information describing the plurality of blocks within the storage devices further comprises scanning the storage devices.

3. The method of claim 1 wherein gathering information describing the plurality of blocks within the storage devices further comprises receiving, from the storage devices, the information describing the plurality of blocks within the storage devices.

4. The method of claim 1 further comprising:
    migrating the data stored in the at least one block to another block in the storage devices.

5. The method of claim 1 further comprising:
    detecting that the predicted lifespan for at least a predetermined number of blocks in a particular storage device are below a predetermined threshold; and
    migrating the data stored on the particular storage device to other storage devices in the storage system.

6. An apparatus comprising a computer processor and a computer memory, the computer memory including computer program instructions that, when executed by the computer processor, cause the apparatus to carry out the steps of:
    gathering, from headers attached to pages within each of a plurality of blocks within a plurality of storage devices in a storage system, information describing a previous state of the plurality of blocks;

training a machine learning block lifespan model using the information, wherein the information identifies characteristics of one or more previously failed blocks of the plurality of blocks as well as characteristics of one or more other blocks of the plurality of blocks that have not previously failed;

determining, based on the information describing the previous state of the plurality of blocks within the storage devices and the machine learning block lifespan model, a predicted lifespan for at least one block, of the plurality of blocks, that stores data;

detecting that the predicted lifespan for the at least one block is below a predetermined block lifespan threshold; and based on the detection, migrating the data stored in the at least one block therefrom.

7. The apparatus of claim 6 wherein gathering information describing the plurality of blocks within the storage devices further comprises scanning the storage devices.

8. The apparatus of claim 6 wherein gathering information describing the plurality of blocks within the storage devices further comprises receiving, from the storage devices, the information describing the plurality of blocks within the storage devices.

9. The apparatus of claim 6 further comprising computer program instructions that, when executed by the computer processor, cause the apparatus to carry out the steps of:
migrating the data stored in the at least one block to another block in the storage devices.

10. The apparatus of claim 6 further comprising computer program instructions that, when executed by the computer processor, cause the apparatus to carry out the steps of:
detecting that the predicted lifespan for at least a predetermined number of blocks in a particular storage device are below a predetermined threshold; and
migrating the data stored on the particular storage device to other storage devices in the storage system.

11. A storage system including a plurality of storage devices,
the storage system including a computer processor and a computer memory, the computer memory including computer program instructions that, when executed by the computer processor, cause the storage system to carry out the steps of:

gathering, from headers attached to pages within each of a plurality of blocks within a plurality of storage devices in a storage system, information describing a previous state of the plurality of blocks;

training a machine learning block lifespan model using the information, wherein the information identifies characteristics of one or more previously failed blocks of the plurality of blocks as well as characteristics of one or more other blocks of the plurality of blocks that have not previously failed;

determining, based on the information describing the previous state of the plurality of blocks within the storage devices and the machine learning block lifespan model, a predicted lifespan for at least one block, of the plurality of blocks, that stores data;

detecting that the predicted lifespan for the at least one block is below a predetermined block lifespan threshold; and based on the detection, migrating the data stored in the at least one block therefrom.

12. The storage system of claim 11 wherein gathering information describing the plurality of blocks within the storage devices further comprises scanning the storage devices.

13. The storage system of claim 11 wherein gathering information describing the plurality of blocks within the storage devices further comprises receiving, from the storage devices, the information describing the plurality of blocks within the storage devices.

14. The storage system of claim 11 further comprising computer program instructions that, when executed by the computer processor, cause the storage system to carry out the steps of:
migrating the data stored in the at least one block to another block in the storage devices.

15. The storage system of claim 11 further comprising computer program instructions that, when executed by the computer processor, cause the storage system to carry out the steps of:
detecting that the predicted lifespan for at least a predetermined number of blocks in a particular storage device are below a predetermined threshold; and
migrating the data stored on the particular storage device to other storage devices in the storage system.

* * * * *